United States Patent
Kurokawa et al.

(10) Patent No.: US 6,867,079 B2
(45) Date of Patent: Mar. 15, 2005

(54) METHOD FOR MANUFACTURING SEMICONDUCTOR DEVICE

(75) Inventors: Atsushi Kurokawa, Takasaki (JP);
Toshiaki Kitahara, Misato (JP);
Hiroshi Inagawa, Maebashi (JP);
Yoshinori Imamura, Sagamiko (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/673,374

(22) Filed: Sep. 30, 2003

(65) Prior Publication Data

US 2004/0063292 A1 Apr. 1, 2004

Related U.S. Application Data

(63) Continuation of application No. 10/347,806, filed on Jan. 22, 2003, now Pat. No. 6,649,458.

(30) Foreign Application Priority Data

Feb. 15, 2002 (JP) ........................................ 2002-038430

(51) Int. Cl.[7] ............................................ H01L 21/338
(52) U.S. Cl. ........................ 438/170; 438/171; 438/319; 438/330
(58) Field of Search ................................ 438/170, 171, 438/172, 202, 235, 312, 314, 317, 319, 330

(56) References Cited

U.S. PATENT DOCUMENTS

| | | | |
|---|---|---|---|
| 5,077,231 A | 12/1991 | Plumton et al. | ............. 438/170 |
| 5,166,083 A | 11/1992 | Bayraktaroglu | ............. 438/170 |
| 5,268,315 A | 12/1993 | Prasad et al. | ............... 438/314 |
| 5,324,671 A | 6/1994 | Bayraktaroglu | ............. 438/317 |
| 5,457,062 A * | 10/1995 | Keller et al. | ................. 438/202 |
| 5,672,522 A | 9/1997 | Streit et al. | .................. 438/312 |

FOREIGN PATENT DOCUMENTS

JP         2001-210723         8/2001

OTHER PUBLICATIONS

Chen et al., "High–Speed InGaP/GaAs HBT's Using a Simple Collector Undercut Technique to Reduce Base–Collector Capacitance," *IEEE Electron Device Letters*, vol. 18, No. 7, Jul. 1997, pp. 355–357.

Ahmari et al., "InGaP/CaAs Heterojunction Bipolar Transistor Grown on a Semi–Insulating InGaP Buffer Layer," *IEEE Electron Device Letters*, vol. 18, No. 11, Nov. 1997, pp. 559–561.

* cited by examiner

*Primary Examiner*—Chandra Chaudhari
(74) *Attorney, Agent, or Firm*—Miles & Stockbridge P.C.

(57) ABSTRACT

The present invention achieves the enhancement of a manufacturing yield factor and the reduction of manufacturing cost in a manufacturing method of a semiconductor device having a hetero junction bipolar transistor (HBT), a Schottky diode and a resistance element. The present invention is directed to the manufacturing method of a semiconductor device in which respective semiconductor layers which become a sub collector layer, a collector layer, a base layer, a wide gap emitter layer and an emitter layer are sequentially formed over one surface of a semiconductor substrate and, thereafter, respective semiconductor layers are processed to form the hetero junction bipolar transistor, the Schottky diode and the resistance element in a monolithic manner. An emitter electrode of the hetero junction bipolar transistor, a Schottky electrode of the Schottky diode and a resistance film of the resistance element are simultaneously formed using a same material (for example, WSiN). Accordingly, the man-hours can be reduced and the manufacturing cost of the semiconductor device can be reduced.

14 Claims, 15 Drawing Sheets

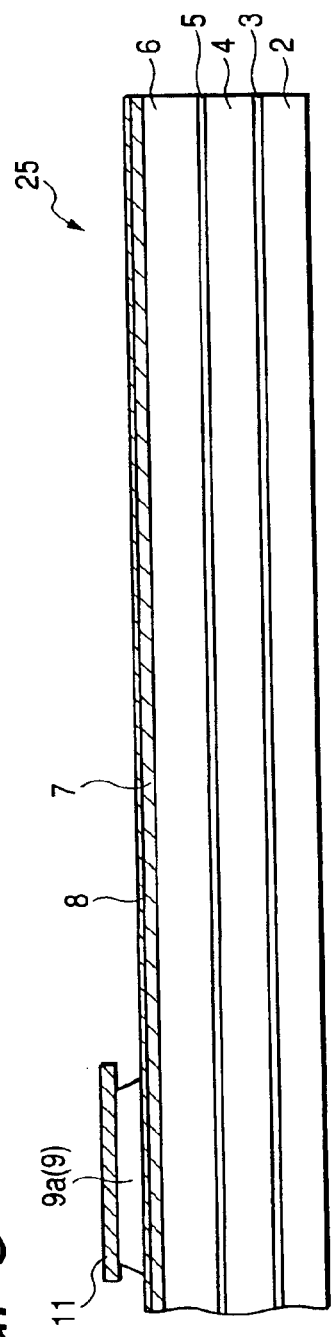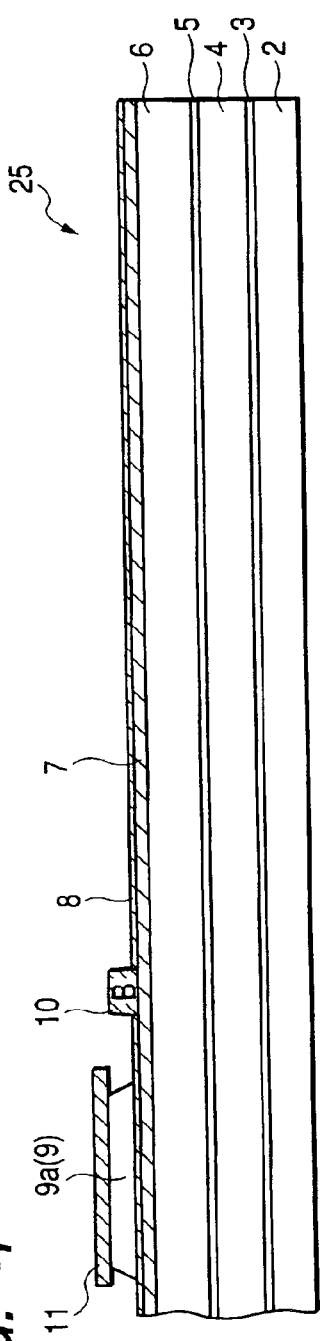

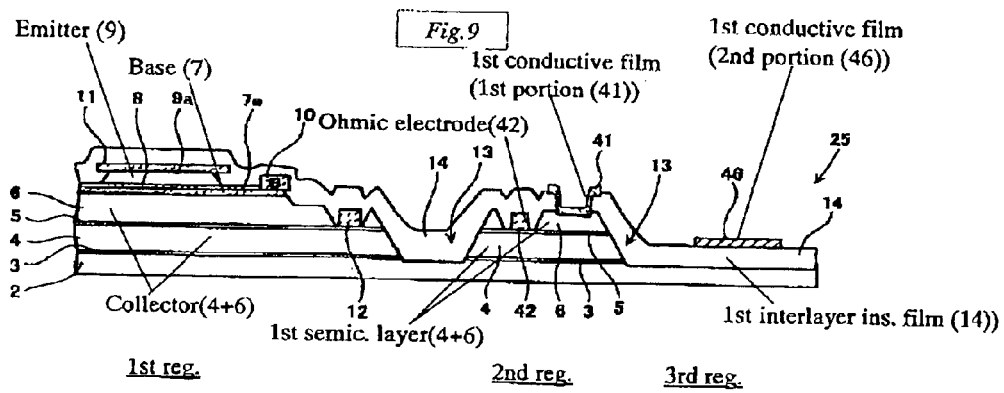
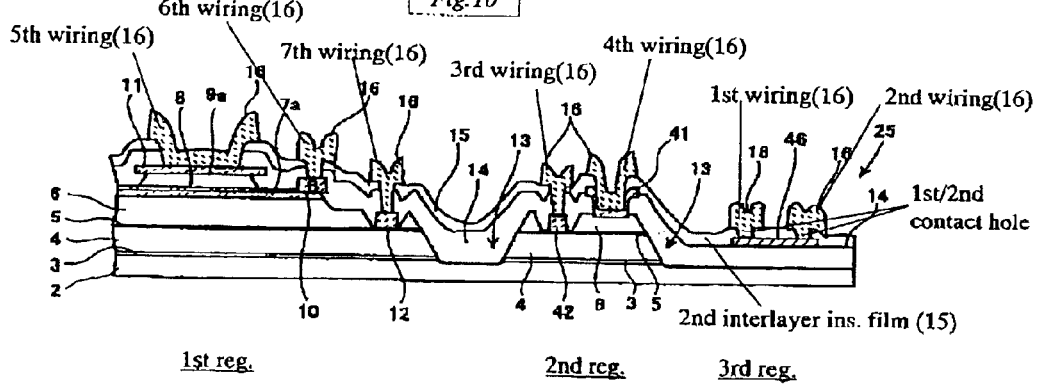

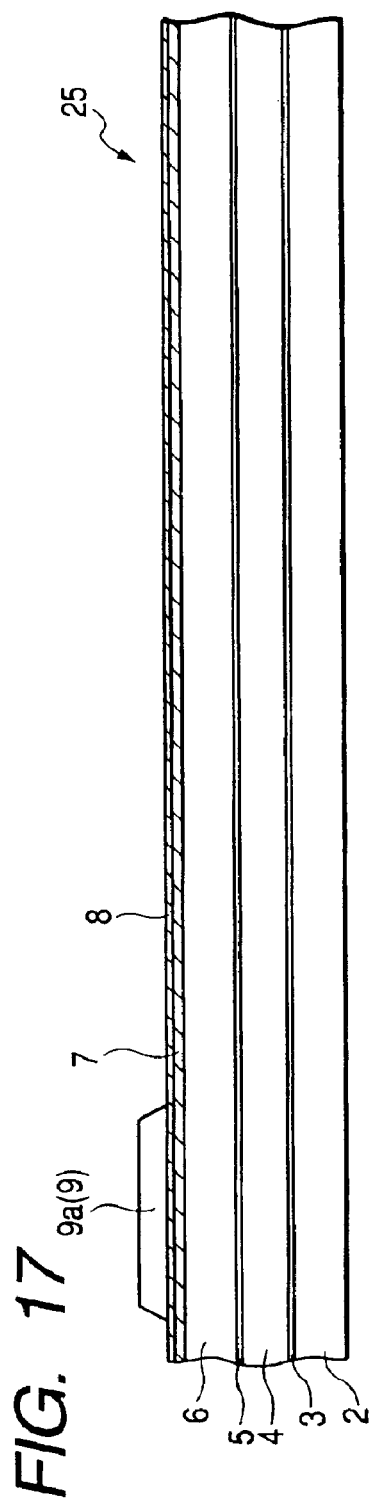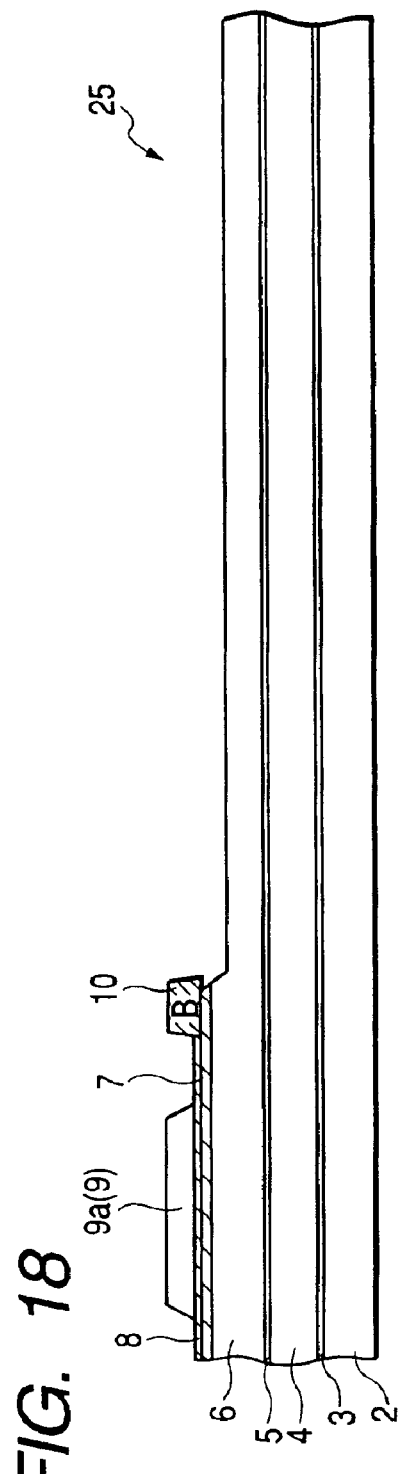

METHOD FOR MANUFACTURING SEMICONDUCTOR DEVICE

CROSS-REFERENCE TO RELATED APPLICATION

This application is a continuation of application Ser. No. 10/347,806 filed Jan. 22, 2003, now U.S. Pat. No. 6,649,458.

BACKGROUND OF THE INVENTION

The present invention relates to a method for manufacturing a semiconductor device, and more particularly to a technique which can be effectively used for the manufacturing of high frequency power amplifier which is mainly comprised of hetero junction bipolar transistors (HBT) which constitute ultrahigh-speed IC elements.

As a semiconductor device which exhibits high speed performance and low power consumption performance, a hetero junction bipolar transistor (hereinafter also referred to as HBT) has been known. This hetero junction bipolar transistor is used in a form that the transistor is incorporated into a high frequency power amplifier (RF power amplifying module) of a mobile communication terminal such as a portable cellular phone.

The HBT has a structure in which a sub-collector layer and a collector layer are sequentially laminated onto one surface (main surface) of a semiconductor substrate, a base layer is partially formed over the collector layer, and an emitter layer which is formed of a semiconductor having a wide band gap is partially formed over the base layer.

In a power amplifying device for transmission in a communication system, the HBT has now been used as a transistor. Such a semiconductor device is described in Japanese Laid-open Patent 210723/2001.

In Japanese Laid-open Patent 210723/2001, a technique for manufacturing a semiconductor device having a bias circuit which suppresses a change of an idle current attributed to a temperature change of a power transistor Tr1 is disclosed. Such a semiconductor device is manufactured using a GaAs substrate as a base and, for compensating for a temperature shift of the idle current, a plurality of Schottky diodes are provided to a base inputting part. The bias circuit is constituted of two transistors (Tr2, Tr3) which are connected to the power transistor Tr1, two Schottky diodes (D1, D2) and three resisters (R1 to R3).

That is, a base terminal of the power transistor Tr1 is connected to a collector terminal of the transistor Tr2 through a resistor R3 in an emitter follower method, and a base terminal of the transistor Tr2 is grounded through the transistor Tr3 which short-circuits a base and a collector of the Schottky diodes D1, D2 thus suppressing the change of the idle current C of the transistor Tr1 which is generated when the temperature changes.

Further, with respect to this semiconductor device, base electrodes and the Schottky electrodes of the HBT are simultaneously formed at the time of manufacturing the semiconductor device.

On the other hand, in the manufacturing of the HBT, for preventing an excessive etching of the sub-collector layer, there has been known a technique which provides an InGaP layer between the sub-collector layer and the collector layer. This technique is described in IEEE Electron Device Lett., vol. 18, p355, 1997.

Further, in IEEE Electron Device Lett., vol. 18, p559, 1997, there is disclosed a technique which enhances the isolation performance by arranging an undoped InGaP layer having a resistance higher than a resistance of an undoped GaAs layer below a collector layer.

SUMMARY OF THE INVENTION

As a transistor which constitutes a high frequency power amplifier (RF power module) for a mobile communication unit, a hetero junction bipolar transistor (HBT) which constitutes a ultra high-speed IC element has been used.

Further, to compensate for a temperature shifting of an idle current in the transistor, a bias circuit which provides a plurality of Schottky diodes to a base inputting part is incorporated. Resistance elements are also incorporated in this bias circuit.

The reduction of manufacturing cost has been requested with respect to the HBT in the same manner as other transistors and modules. With respect to the power transistor into which the bias circuit is incorporated, as described in the above-mentioned literature, there has been proposed the method which simultaneously forms the Schottky electrodes and the base electrodes using a same material.

To explain manufacturing steps thereof, as shown in FIG. 23(a), a semiconductor layer (n type GaAs layer) below an emitter electrode 56 is etched using the emitter electrode 56 as a mask until the etching reaches a surface of a semiconductor layer (n type InGaP layer) which constitutes a wide gap emitter layer 54 below the semiconductor layer ($n^+$ type GaAs layer) thus forming a mesa-shaped emitter layer 55.

Thereafter, an etching mask not shown in the drawing is formed and, as shown in FIG. 23(a), using this etching mask as a mask, a semiconductor layer which constitutes the wide gap emitter layer 54 which is exposed in a periphery of the emitter layer 55, a semiconductor layer (p-type GaAs layer) which constitutes a base layer 53 below the semiconductor layer, and a semiconductor layer ($n^+$ type GaAs layer) 52a which constitutes a collector layer below the base layer 53 are sequentially etched, wherein the semiconductor layer 52a is etched to an intermediate depth thereof, thus forming the base layer having a mesa shape (mesa-shaped base layer) 53.

Subsequently, a base electrode 57 and a Schottky electrode 58 are simultaneously formed, wherein the base electrode 57 is formed over the wide gap emitter layer 54 in the periphery of the emitter layer 55 and the Schottky electrode 58 is formed over the semiconductor layer ($n^+$ type GaAs layer) 52a which constitutes a collector layer in a Schottky diode forming region which is disposed away from a region where the HBT is formed. The base electrode 57 is subjected to an alloying treatment (heating treatment).

As a result, the wide gap emitter layer 54 below the base electrode 57 is alloyed so that a base electrode 57 and the base layer 53 are electrically connected to each other.

Further, in the manufacturing of the HBT, as shown in FIG. 23(a), a substrate (wafer) which is eventually produced by sequentially forming respective semiconductor layers consisting of a sub collector layer 51, the collector layer 52, the mesa-shaped base layer 53, the wide gap emitter layer 54 and the emitter 55 over one surface (main surface) of a semi-insulation GaAs substrate 50 is used.

However, in the method which forms the base electrode over the semiconductor layer which constitutes the wide gap emitter layer 54, it is necessary to form holes for forming the base electrode in the etching mask. Accordingly, in view of the mask alignment tolerance for forming this hole, it is necessary to ensure the mask alignment tolerance length between an outer periphery of the base electrode 57 and an outer periphery of a mesa-shaped base layer 53 in FIG. 23(b). As a result, a junction area between the base layer 53 and the collector layer 52 is increased. The increase of the area between the base and the collector deteriorates the high frequency characteristics (for example, maximum oscillation frequency f max).

Then, as shown in FIG. 24, when the mask alignment tolerance length is shortened, the outer periphery of the base electrode 57 extends beyond the periphery of the mesa-shaped base layer 53 and is brought into contact with the collector layer 52 (contact portion 70) thus giving rise to a short-circuit defect. This leads to the lowering of a yield factor and brings about a drawback that a manufacturing cost is pushed up.

To prevent the outer periphery of the base electrode 57 from extending beyond the mesa-shaped base layer 53 and coming into contact with the semiconductor layer ($n^+$ type GaAs layer) 52a which constitutes the collector layer, it is necessary to ensure a minimum mask alignment tolerance length "a". FIG. 25 is a schematic view for showing the size relationship among respective portions in the manufacturing of the HBT while ensuring the mask alignment tolerance length "a".

A base-collector junction length L2 is a length which is obtained by adding 2× mask alignment tolerance length "a" to a distance (distance between outer peripheries) "b" between one outer periphery of the base electrode 57 and another outer periphery which is disposed opposite to one outer periphery of the base electrode 57 and hence, the high frequency power amplifier becomes large-sized. The distance between outer peripheries ("b") is a sum of a width "d" of the base electrode 57, a length "c" of the emitter electrode 56 and a distance "e" from a periphery of the emitter electrode 56 to an inner periphery of the base electrode 57.

The inventors of the present invention have studied the above-mentioned distances and widths from a viewpoint of miniaturization of the HBT element and have obtained following sizes of respective portions as a result of the study. That is, the lengths and the widths are set such that c=4 $\mu$m, d=1 $\mu$m, e=1 $\mu$m and b=8 $\mu$m. Further, by setting the mask alignment tolerance length "a" as a=0.8 $\mu$m, the base-collector junction length L2 becomes 9.6 $\mu$m.

On the other hand, to ensure the insulation separation (isolation) between the HBT and the other element arranged close to the HBT, there has been known a structure which provides a separation groove between the elements by etching. In performing this etching, when the etching is insufficient, the separation groove is not formed thus giving rise to a short-circuit defect, while when the etching is excessive, a large stepped portion is formed and hence, a line which is arranged traversing the stepped portion is disconnected due to the large stepped portion.

FIG. 26 is a schematic view showing an example of a defect caused by the insufficient etching or the excessive etching. For example, an area inside a left frame in FIG. 26 constitutes a region A for forming the HBT and an area inside a right frame in FIG. 26 constitutes a region B for forming another element such as a Schottky diode, for example. In the region A for forming the HBT, lines "a" to "c" which are respectively connected to an emitter electrode E, a base electrode B and a collector electrode C traverse the separation groove, while in the region B for forming the Schottky diode, a line "d" which is connected to a Schottky electrode st traverses the separation groove.

When the etching becomes insufficient in the formation of the separation groove, there arises a case that a defective isolation is generated between the region A for forming the HBT and the region B for forming the Schottky diode as indicated by (1) in FIG. 26. Further, when the etching is excessive, a stepped portion of the separation groove at the periphery of the region A for forming the HBT or the periphery of the region B for forming the Schottky diode is enlarged and hence, the line "a", the line "c" or the line "d" is disconnected at the stepped portion as indicated by (2) in FIG. 26. Further, when the stepped portion is large, in forming the lines by etching, the etching of the portion which is arranged along the stepped portion can not be performed favorably and hence, a metal layer for forming the line remains as indicated by (3) in FIG. 26. The lines which are arranged closed to each other are connected due to this residual metal h thus giving rise to a short-circuit defect. Such an excessive or insufficient etching lowers a manufacturing yield factor thus pushing up a product cost.

Accordingly, it is an object of the present invention to provide a method for manufacturing a semiconductor device which can achieve the enhancement of a yield factor as well as the reduction of a manufacturing cost.

It is another object of the present invention to provide a method for manufacturing a semiconductor device which exhibits the excellent high frequency characteristics and can be manufactured at a low cost by narrowing an area between a base and collector in a hetero junction bipolar transistor.

The above-mentioned and other objects and novel features of the present invention will become apparent from the description of this specification and attached drawings.

To briefly explain the summary of typical inventions described in the inventions disclosed in the present application, they are as follows.

(1) In a method for manufacturing a semiconductor device in which a plurality of semiconductor layers are sequentially formed in a laminated manner over a semiconductor substrate, a hetero junction bipolar transistor, a Schottky diode and a resistance element are formed in a monolithic manner, and a separation groove for establishing an electric insulation is formed at least between the hetero junction bipolar transistor and the Schottky diode, respective semiconductor layers which are formed into a sub collector layer, a collector layer, a base layer, a wide gap emitter layer and an emitter layer are sequentially formed over one surface of the semiconductor substrate and, thereafter, in the manufacture of the hetero junction bipolar transistor, among the above-mentioned respective semiconductor layers, given semiconductor layers are formed in given patterns by sequential etching thus sequentially forming an emitter layer, a wide gap emitter layer, a base layer, a collector layer and a sub collector layer, and at the same time, an emitter electrode is formed over the emitter layer, an alloying treatment is applied to the wide gap emitter layer which extends around the emitter layer thus forming a base electrode which is electrically connected to the base layer, and a collector electrode is formed over the collector layer which extends around the base layer thus forming the hetero junction bipolar transistor, in the manufacture of the Schottky diode, a Schottky electrode is formed over a semiconductor layer corresponding to the collector layer, and an ohmic electrode for diode is formed over a semiconductor layer corresponding to the sub collector layer thus forming the Schottky diode, in the manufacture of the resistance element, a resistance film is formed over an insulation film in a region outside a region where the hetero junction bipolar transistor and the Schottky diode are formed, and the Schottky electrode and the resistance film are simultaneously formed using a same material.

Further, the semiconductor substrate is formed of a semi-insulating GaAs substrate, the sub collector layer is formed of a first conductive-type GaAs layer, the collector layer is formed of a first conductive-type GaAs layer, the base layer is formed of a second conductive-type GaAs layer, the wide gap emitter layer is formed of a first conductive-type InGaP layer, the emitter layer is formed of a first conductive type GaAs layer having an InGaAs layer as a surface layer thereof, the etching stopper layer is formed of a first conductive-type InGaP layer. The Schottky electrode and the resistance film are made of alloy which mainly contains a high melting-point material or a silicide and have given portions on which lines made of aluminum are overlapped.

Due to such a constitution, the Schottky diode and the resistance film can be formed simultaneously and hence, man-hours can be reduced so that a product cost can be reduced.

(2) In the above-mentioned constitution (1), the base electrode is formed such that the base electrode surrounds the emitter layer and, at the same time, a region ranging from the base electrode to the inside of the base electrode except for an outer periphery of the base electrode is covered with a mask for etching, and the collector layer is etched to an intermediate depth thereof using the mask for etching and the base electrode as masks thus forming the mesa-shaped base layer. Due to such a constitution, it is possible to reduce a base-collector junction area so that the high frequency characteristics (for example, maximum oscillation frequency fmax and the like) of the hetero junction bipolar transistor can be enhanced.

(3) In the above-mentioned constitution (1), an etching stopper layer which is formed of a material having an etching speed lower than an etching speed of the sub collector layer is formed between the semiconductor substrate and the sub collector layer and, at the same time, an etching stopper layer which is formed of a material having an etching speed lower than an etching speed of the collector layer is formed between the sub collector layer and the collector layer, an etching which is performed to expose the sub collector layer by etching the collector layer is completed by stopping the etching at the etching stopper layer, and the formation of the separation groove includes an etching treatment in which etching of the sub collector layer is stopped at the etching stopper layer, an etching treatment in which the etching stopper layer is etched, and an etching treatment in which a surface layer portion of the semiconductor substrate is etched. Due to such a constitution, it is possible to prevent a shortage of etching and an excessive etching and so that an isolation defect attributed to the shortage of etching can be suppressed and a disconnection of lines or a short-circuit between lines which occurs at a stepped portion attributed to the excessive etching can be prevented whereby a manufacturing yield factor is enhanced and a production cost can be reduced. This constitution (3) is particularly effective (a) when it is necessary to lower the resistance of the sub collector by increasing a thickness of the sub collector layer and (b) when it is necessary to increase a collector breakdown strength and to reduce a collector capacitance by increasing a thickness of the collector layer. For example, with respect to a GaAs HBT for power use, a sub collector layer and a collector layer whose total thickness is equal to or more than 1 μm are usually used.

BRIEF EXPLANATION OF THE DRAWINGS

FIG. 3 is a cross-sectional view of a portion of a semiconductor substrate on which a mesa-shaped emitter layer is formed in a method for manufacturing the high frequency power amplifier of the embodiment 1.

FIG. 4 is a cross-sectional view of a portion of a semiconductor substrate on which a base electrode is formed in a method for manufacturing the high frequency power amplifier of the embodiment 1.

FIG. 9 is a cross-sectional view of a portion of a semiconductor substrate on which a Schottky electrode for diode and a resistance film are formed in a method for manufacturing the high frequency power amplifier of the embodiment 1.

FIG. 10 is a cross-sectional view of a portion of a semiconductor substrate on which lines are formed in a method for manufacturing the high frequency power amplifier of the embodiment 1.

FIG. 17 is a cross-sectional view of a portion of a semiconductor substrate on which a mesa-shaped emitter layer is formed in a method for manufacturing a high frequency power amplifier in which a bias circuit is incorporated which constitutes another embodiment (embodiment 3) of the present invention.

FIG. 18 is a cross-sectional view of a portion of a semiconductor substrate on which a mesa-shaped base layer is formed in a method for manufacturing a high frequency power amplifier of the embodiment 3.

DESCRIPTION OF PREFERRED EMBODIMENT

Preferred embodiments of the present invention are explained in detail hereinafter in conjunction with attached drawings. In all drawings which are served for explaining the embodiments of the present invention, parts having same functions are indicated by same numerals or symbols and repeated explanation thereof is omitted.

(Embodiment 1)

Figure 1:
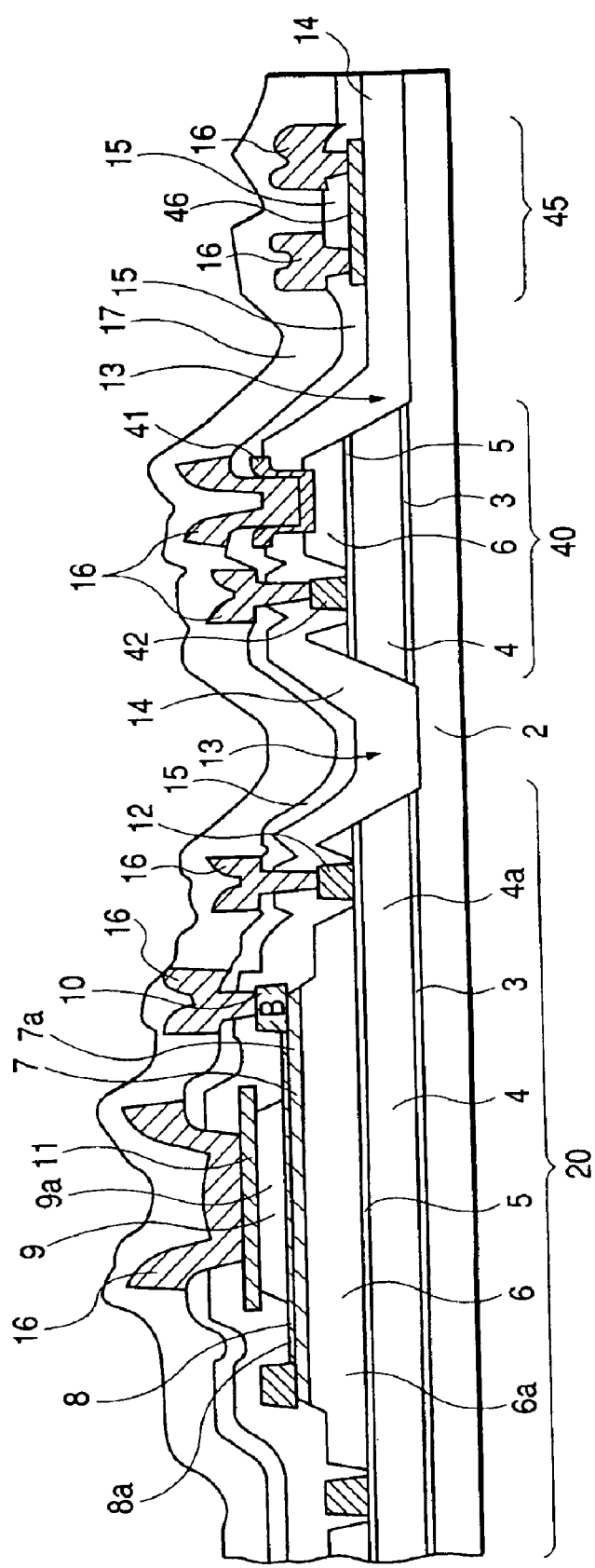
FIG. 1 is a cross-sectional view showing a portion of a high frequency power amplifier in which a bias circuit is incorporated according to one embodiment (embodiment 1) of the present invention.
Figure 2:
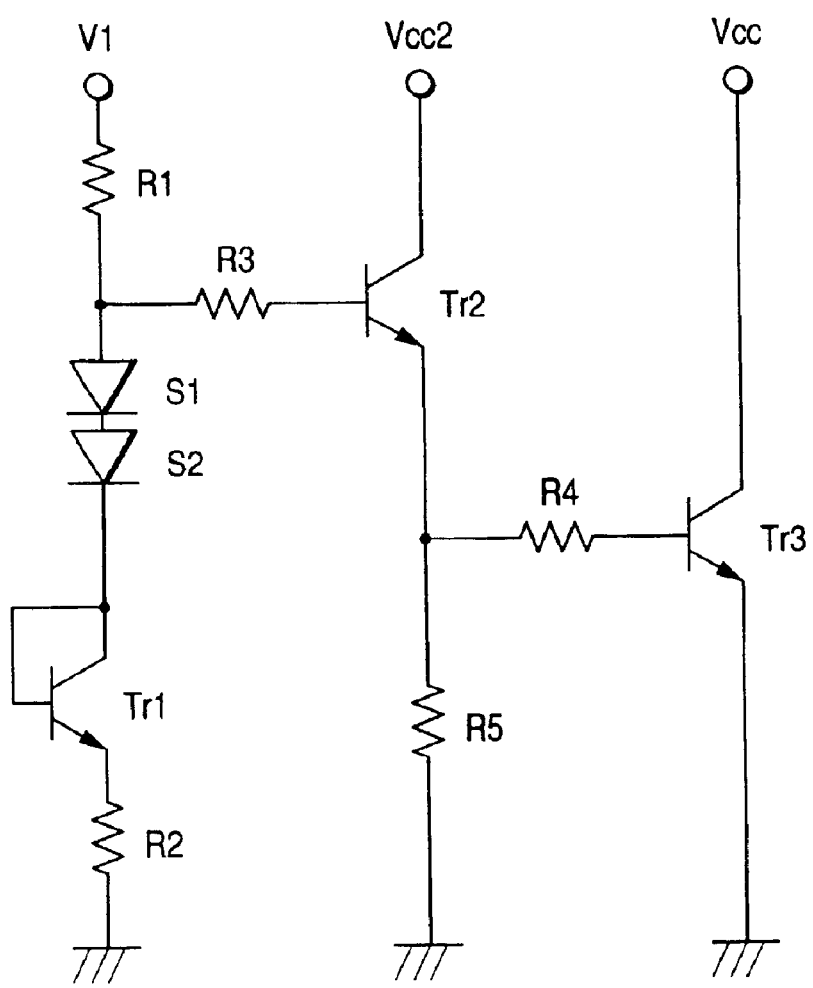
FIG. 2 is an equivalent circuit diagram of the high frequency power amplifier of the embodiment 1.

FIG. 1 to FIG. 12 are views which are related to a high frequency power amplifier in which a bias circuit is incorporated and a method for manufacturing the high frequency power amplifier in one embodiment (embodiment 1) of the present invention. In these drawings, FIG. 1 is a cross-sectional view showing a portion of the high frequency power amplifier and FIG. 2 is an equivalent circuit diagram of the high frequency power amplifier, and FIG. 3 to FIG. 9 are cross-sectional views showing a portion of a semiconductor substrate in respective manufacturing steps of the high frequency power amplifier.

The semiconductor device 1 of the embodiment 1 is, as shown in FIG. 1, comprised of a hetero junction bipolar transistor (HBT) 20, a Schottky diode 40 and a resistance element 45. These HBT 20, the Schottky diode 40 and the resistance element 45 are formed by processing semiconductor layers or the like which are formed in multi-layers on one surface (main surface) of a semiconductor substrate 2.

As the semiconductor substrate 2, a semi-insulating GaAs substrate 2 is used, for example. At a portion of the hetero junction bipolar transistor 20, on a portion of main surface of the above-mentioned semi-insulating GaAs layer 2, a first conductive-type (n-type, for example) n-type GaAs layer 4 is formed by way of an n-type InGaP layer 3. The n-type InGaP layer 3 constitutes a sub collector layer 4a and this n-type InGaP layer 3 functions as an etching stopper layer when the sub collector layer 4a is formed by etching the n-type GaAs layer 4.

Over the n-type GaAs layer 4, the n-type GaAs layer 6 is formed by way of an n-type InGaP layer 5. The n-type GaAs layer 6 constitutes a collector layer 6a and the n-type InGaP layer 5 functions as an etching stopper layer when the collector layer 6a is formed by etching the n-type GaAs layer 6.

Over the collector layer 6a, a base layer 7a which is constituted of a second conductive p-type GaAs layer 7 is formed. The base layer 7a is formed in a square shape and a base electrode 10 is formed over a periphery thereof. Over the base layer 7a inside the base electrode 10, a wide gap emitter layer 8a which is constituted of an n-type InGaP layer 8 is formed. The n-type InGaP layer 8 adopts the wide band gap constitution.

Since the base layer 7a is formed by etching which uses the base electrode 10 also as a mask for etching, the base layer 7a is formed into a mesa-shaped base layer in which the periphery of the base layer 7a is retracted inwardly from an outer periphery of the base electrode 10. Accordingly, the outer periphery of the base electrode 10 projects outwardly from the base layer 7a in an overhanging manner or like eaves. The etching naturally reaches a surface layer portion of the collector layer 6a.

Further, since the base electrode 10 is subjected to the alloying treatment after the base electrode 10 is formed over the n-type InGaP layer 8, the n-type InGaP layer 8 below the base electrode 10 is alloyed and the base electrode 10 is electrically connected to the base layer 7a through this alloy layer.

Over a portion of, that is, over a center portion of the wide gap emitter layer 8a, an emitter layer 9a which is constituted of an n-type InGaAs/n-type GaAs layer 9 (n-type GaAs layer having an n-type InGaAs layer on a surface thereof for having an ohmic contact with an emitter electrode) is formed. An emitter electrode 11 is formed over the emitter layer 9a. Since the emitter layer 9a is formed by etching using the emitter electrode 11 which is formed over the n-type InGaAs/n-type GaAs layer 9 (hereinafter simply expressed as the n-type GaAs layer 9) as a mask for etching, an outer periphery of the emitter electrode 11 also projects from a periphery of the emitter layer 9a in an overhanging manner.

The collector layer 6a which projects from the periphery of the base layer 7a and is disposed below the base layer 7a by one stage has a portion thereof removed and a collector electrode 12 is formed over the n-type InGaP layer 5 which is exposed by such a removal. Although the n-type InGaP layer 5 which functions as an etching stopper layer is interposed between the collector electrode 12 and the sub collector layer 4a, since the layer is of n-type, the collector electrode 12 and the sub collector layer 4a are electrically connected to each other.

The HBT 20 is held in an electrically independent state by being isolated. That is, a separation groove 13 which reaches a surface layer of the semi-insulating GaAs substrate 2 is formed in the periphery of the HBT 20 so that the HBT 20 has the electrically independent constitution. Due to the formation of the separation groove 13 for isolation, the n-type GaAs layer 4 is formed into the sub collector layer 4a in a region where the HBT 20 is formed.

The sub collector layer 4a, the n-type InGaP layer 5, the collector layer 6a, the base layer 7a, the base electrode 10, the wide gap emitter layer 8a, the emitter layer 9a and the emitter electrode 11 formed over the semi-insulating GaAs substrate 2 are covered with an insulation film 14. Further, an interlayer insulation film 15 is formed over the insulation film 14 in an overlapped manner.

Contact holes are formed in the insulation film 14 and the interlayer insulation film 15 at given places. Lines 16 having a given pattern are formed over these contact holes and the interlayer insulation film 15. Given portions of the lines 16 are respectively connected to the base electrode 10, the emitter electrode 11 and the collector electrode 12. The lines 16 are, for example, formed of aluminum.

Further, the lines 16 and the interlayer insulation film 15 are covered with an insulation film 17 which constitutes a final passivation film. Although not shown in the drawings, the insulation film 17 is partially removed by etching so as to expose portions of lines which constitute external electrode terminals. These external electrode terminals correspond to V1, Vcc2, Vcc in a circuit diagram shown in FIG. 2, for example.

The Schottky diode 40 includes an n-type InGaP layer 3, an n-type GaAs layer 4, an n-type InGaP layer 5 and an n-type GaAs layer 6 which are formed in an overlapped manner over the semi-insulating GaAs substrate 2 which is surrounded by the separation groove 13. A Schottky electrode 41 which constitutes one electrode of the Schottky diode 40 is selectively formed over the n-type GaAs layer 6. Further, the n-type GaAs layer 6 is partially removed by etching and an ohmic electrode 42 for diode which constitutes another electrode of the Schottky diode is formed over the exposed n-type InGaP layer 5.

The Schottky diode forming region which is surrounded by the separation groove 13 is also covered with the insulation film 14 and the interlayer insulation film 15 which is overlapped to the insulation film 14. Further, contact holes are formed at given places by selectively removing the interlayer insulation film 15 and the insulation film 14. Lines 16 having a given pattern are formed over these contact holes and the interlayer insulation film 15. Given portions of these lines 16 are respectively connected to the Schottky electrode 41 and the ohmic electrode 42 for diode. The lines 16 are formed of aluminum as mentioned above.

The resistance element 45 is constituted of a resistance film 46 which is selectively formed over the insulation film 14 which covers a surface of the semi-insulating GaAs substrate 2 which is etched at the time of forming the separation groove 13 and lines 16 which are connected to respective ends of the resistance film 46. That is, the resistance film 46 is covered with the interlayer insulation film 15, contact holes are formed in the interlayer insulation film 15 at portions thereof corresponding to both end portions of the resistance film 46, and the lines 16 are electrically connected to the resistance film 46 through the contact holes.

In this embodiment 1, the Schottky electrode 41 and the resistance film 46 are formed simultaneously using the same material. Further, to form the resistance film and to establish the Schottky junction, the Schottky electrode 41 and the resistance film 46 are formed of alloy containing mainly a high melting point material such as WSiN or silicide. A film thickness of the WSiN film is, for example, 0.1 to 0.5 $\mu$m and is 0.2 $\mu$m in this embodiment 1.

To reduce the electric resistance of the Schottky electrode 41, the film thickness of the WSiN film is set thin, that is, to 0.2 $\mu$m and, at the same time, the line 16 which is connected to the WSiN film is overlapped to the WSiN film by a given length. Here, the lines 16 may be formed of a metal layer for reducing the electric resistance.

When the size of the Schottky electrode 41 is set to the size of 10 $\mu$m×10 $\mu$m, the parasitic resistance is 0.2 $\Omega$ even when the thickness of the WSiN is 1 $\mu$m and hence, there arises no problem. Further, with respect to the resistance film, the film is made thin to maintain the flatness. The resistance ratio $\rho$ of WSiN is changed corresponding to the composition of nitrogen and silicon and can take a resistance value of 500 to 5000 $\mu\Omega$cm, for example. In this case, the sheet resistance ps of the resistance film can be set to 10 to 500 $\Omega/\square$ based on a formula $\rho s=\rho/t$, wherein t is a thickness of the resistance film.

Further, as the material of Schottky electrode and the resistance film, WSi, WN, TaSi, TaN, TaSiN, TiN, TiSiN, MoSi, MoSiN and the like can be used.

In this embodiment 1, the emitter electrode 11 is formed of WSi, the base electrode 10 is formed of Au/Ti/Mo/Ti/Pt, and the collector electrode 12 and the ohmic electrode 42 for diode are formed of AuGe.

Then, the method for manufacturing the semiconductor device 1 is explained in conjunction with FIG. 3 to FIG. 10.

By sequentially laminating the n-type InGaP layer 3, the n-type GaAs layer 4, the n-type InGaP layer 5, the n-type GaAs layer 6, the p-type GaAs layer 7, the n-type InGaP layer 8, and the n-type GaAs layer 9 to a main surface of the semi-insulating GaAs substrate 2 using a MOCVD (Metalorganic Chemical Vapor Deposition) method or the like, a wafer 25 is formed. The n-type InGaP layer 8 constitutes the wide band gap layer. To show an example of thicknesses of respective semiconductor layers, the semi-insulating GaAs substrate 2 has a thickness of 625 $\mu$m, the n-type InGaP layer 3 has a thickness of 20 nm, the n-type GaAs layer 4 has a thickness of 700 nm, the n-type InGaP layer 5 has a thickness of 20 nm, the n-type GaAs layer 6 has a thickness of 700 nm, the p-type GaAs layer 7 has a thickness of 100 nm, the n-type InGaP layer 8 has a thickness of 35 nm, and the n-type InGaAs/n-type GaAs layer 9 (the n-type GaAs layer 9) has a thickness of 400 nm. The n-type InGaAs layer which constitutes a surface layer of the n-type InGaAs/n-type GaAs layer 9 is a layer having an ohmic contact with an emitter electrode and has a thickness of approximately 100 nm. Here, since the n-type InGaP layer 3 is necessary in a method for separating elements, in many cases, the layer 3 may be preferably formed of an n-type layer having low concentration by suppressing n-type impurities. Further, although the GaAs substrate 2 has a thickness of 625 $\mu$m at the time of manufacturing the substrate 2 initially, the thickness is reduced to 100 to 50 $\mu$m at the final manufacturing step and hence, the thermal resistance of the semiconductor substrate is lowered so that the GaAs substrate 2 can be used as a product.

Subsequently, as shown in FIG. 3, the emitter electrode 11 having a given size is formed over the n-type GaAs layer 9 using a photolithography technique and an etching technique which are adopted usually. The emitter electrode 11 is formed of WSi, for example, and is formed with a thickness of approximately 200 nm. Thereafter, the n-type InGaAs/n-type GaAs layer 9 is etched using the emitter electrode 11 as an etching mask. The etching is performed by wet etching which uses a mixed aqueous solution of phosphoric acid and hydrogen peroxide. Since the n-type InGaP layer 8 functions as an etching stopper layer, it is possible to surely remove the n-type InGaAs/n-type GaAs layer 9 by selecting an etching time. Due to this wet etching, the mesa-shaped emitter layer 9a can be formed.

Subsequently, as shown in FIG. 4, the base electrode 10 is formed using a lift-off method and an alloying treatment. That is, an insulation film made of $SiO_2$ is formed over a whole area of a surface of the wafer 25, openings are formed in the insulation film at some places using a photo resist, and a metal film is formed over the insulation film by a sputtering method. For example, a multi-layered film (thickness: 300 nm) formed of Au/Ti/Mo/Ti/Pt which uses Pt as a lowermost layer is formed by a sputtering method. Thereafter, electrodes can be formed in the opening portions by removing the photo resist. Then, the alloying treatment is performed by heat treatment. Due to this alloying treatment, Pt which constitutes the lowermost layer is alloyed by the reaction with the n-type InGaP layer 8 and the p-type GaAs layer 7 and is brought into an ohmic contact with the p-type GaAs layer 7. The base electrode 10 is, as shown in FIG. 1, formed such that the base electrode 10 surrounds the emitter layer 9a.

Figure 5:
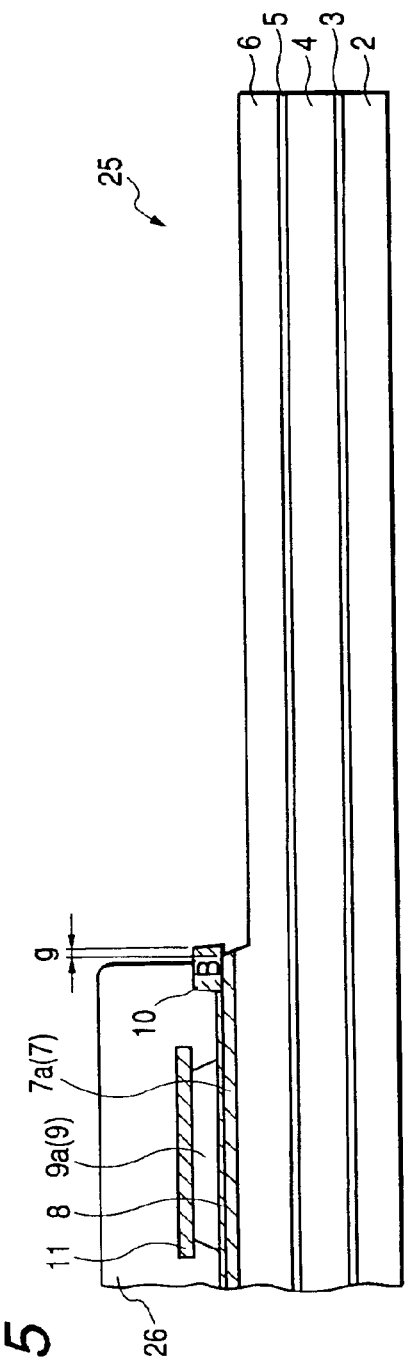
FIG. 5 is a cross-sectional view of a portion of a semiconductor substrate on which a mesa-shaped base layer is formed in a method for manufacturing the high frequency power amplifier of the embodiment 1.

Subsequently, as shown in FIG. 5, to form the mesa-shaped base layer, a photo resist film 26 is selectively formed over a surface of the wafer 25. The photo resist film 26 is formed such that the photo resist film 26 extends over the base electrode 10 which is arranged to surround the emitter layer 9a from above the emitter layer 9a. To use the base electrode 10 as an etching mask, the photo resist film 26 is formed such that an outer periphery of the base electrode 10 is exposed. Then, using the base electrode 10 and the photo resist film 26 as masks, the n-type InGaP layer 8 and the p-type GaAs layer 7 which is disposed below the n-type InGaP layer 8 are etched. In etching the p-type GaAs layer 7, a surface layer portion of the n-type GaAs layer 6 is also etched. With this etching, the mesa-shaped base layer 7a is formed. Here, an upper periphery of the base layer 7a is disposed at a position inside the outer periphery of the base electrode 10 by "g".

The etching of the n-type InGaP layer 8 is performed by wet etching which uses hydrochloric acid and the etching of the p-type GaAs layer 7 and the surface layer portion of the n-type GaAs layer 6 is performed by wet etching which uses a mixed aqueous solution of phosphoric acid and hydrogen peroxide. Since the n-type GaAs layer 6 is etched by approximately 300 nm, the n-type GaAs layer 6 still maintains a thickness of approximately 400 nm. After performing etching, the photo resist film 26 is removed.

Figure 11:
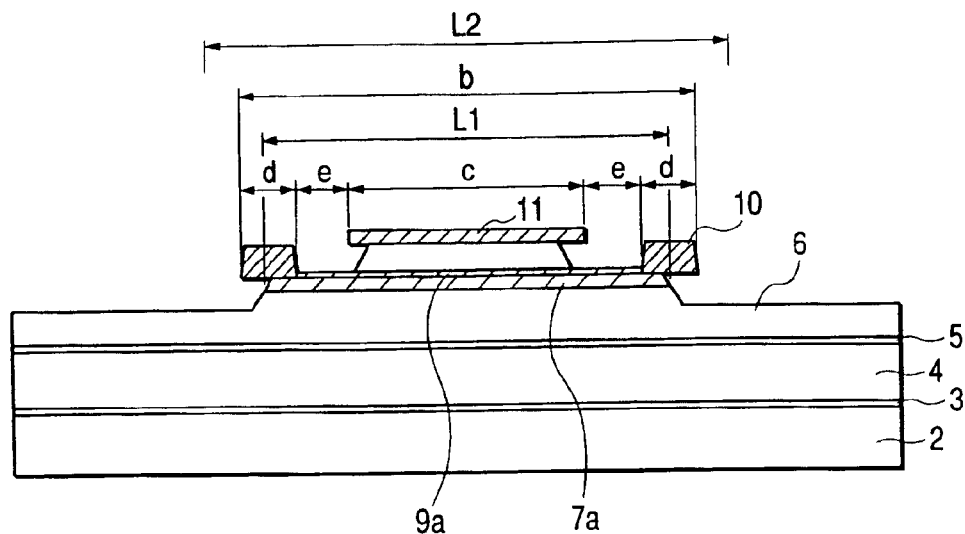
FIG. 11 is a schematic view showing a miniaturized base-collector junction portion in the high frequency power amplifier of the embodiment 1.

Depending on the degree of this etching, the size (area and length) of the base-collector junction is determined. FIG. 11 is a schematic view showing the base-collector junction portion. The drawing corresponds to FIG. 25 and shows a state in which the miniaturization of the base-collector junction is achieved due to the embodiment 1.

Figure 25:
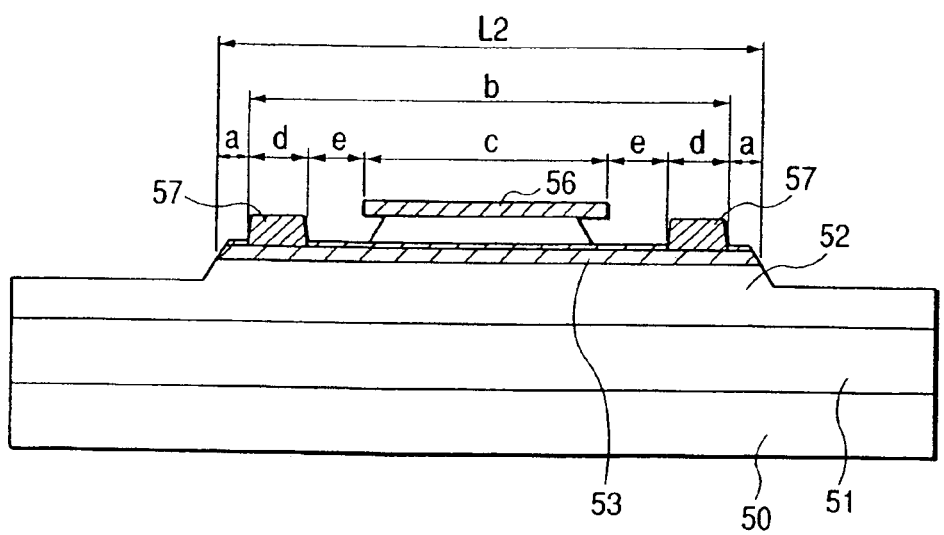
FIG. 25 is a schematic view showing a base-collector junction portion in a high frequency power amplifier which is manufactured prior to the present invention.

According to this embodiment 1, the etching is performed by making use of the base electrode 10 as the etching mask and hence, a base-collector junction length L1 becomes shorter than a distance between one outer periphery of the base electrode 10 and the other outer periphery opposed to the one outer periphery (distance between outer peripheries) "b" due to an action of side etching and becomes shorter than a base-collector junction length L2 shown in FIG. 25.

In FIG. 11, the base-collector junction length L2 is indicated for a comparison purpose. The distance between outer peripheries "b" is a sum of a width "d" of the base electrode 10, a length "c" of the emitter electrode 56 and a distance "e" from a periphery of the emitter electrode 56 to an inner periphery of the base electrode 10.

According to this embodiment 1, when the distance between outer peripheries "b" of the base electrode 10 is set to 8 $\mu$m in the same manner as the structure shown in FIG. 25, the outer peripheries of the mesa-shaped base layer 7a are respectively retracted toward the inside by 0.4 $\mu$m by side etching and hence, the base-collector junction length L1 takes a small value, that is, 7.2 $\mu$m. This value is smaller by 2.4 $\mu$m than the value shown in FIG. 25. Accordingly, it is possible to miniaturize the hetero junction bipolar transistor 20.

Figure 6:
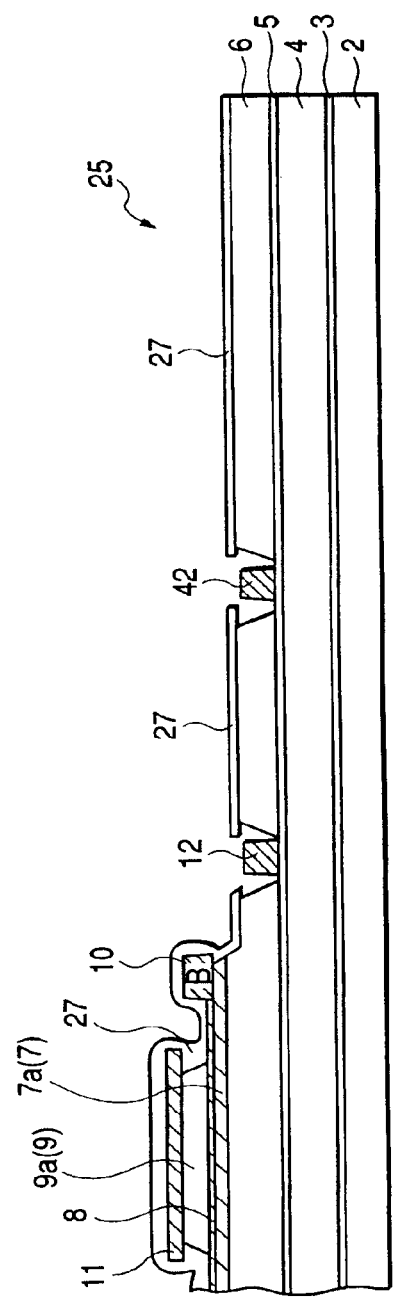
FIG. 6 is a cross-sectional view of a portion of a semiconductor substrate on which a collector electrode and a diode electrode are formed in a method for manufacturing the high frequency power amplifier of the embodiment 1.

Subsequently, as shown in FIG. 6, an insulation film 27 having a thickness of 100 nm which is made of $SiO_2$ is formed over the surface of the wafer 25. Thereafter, the n-type GaAs layer 6 is selectively etched by the photolithography technique or the etching technique which are usually employed so as to form contact holes for forming electrodes. Then, the collector electrode 12 and the ohmic electrode 42 for diode are formed by a lift-off method. The collector electrode 12 and the ohmic electrode 42 for diode having a thickness of 300 nm are formed using AuGe by a sputtering method.

In etching the above-mentioned n-type GaAs layer 6, wet etching which uses a mixed aqueous solution of phosphoric acid and hydrogen peroxide is adopted and hence, although it is possible to completely etch the n-type GaAs layer 6 in the etching region, the n-type InGaP layer 5 below the n-type GaAs layer 6 is not etched. Accordingly, the thickness of the n-type GaAs layer 4 is not changed so that the collector resistance value is not changed whereby there is no possibility that the collector resistance is increased by etching.

Subsequently, the insulation film 28 for forming the separation groove for isolation is selectively formed over the surface of the wafer 25 by the photolithography technique and the etching technique which are usually employed. The insulation film 28 is made of $SiO_2$ and the insulation film 27 is integrally formed with the insulation film 28. Accordingly, the symbol is set to 28.

Figure 7:
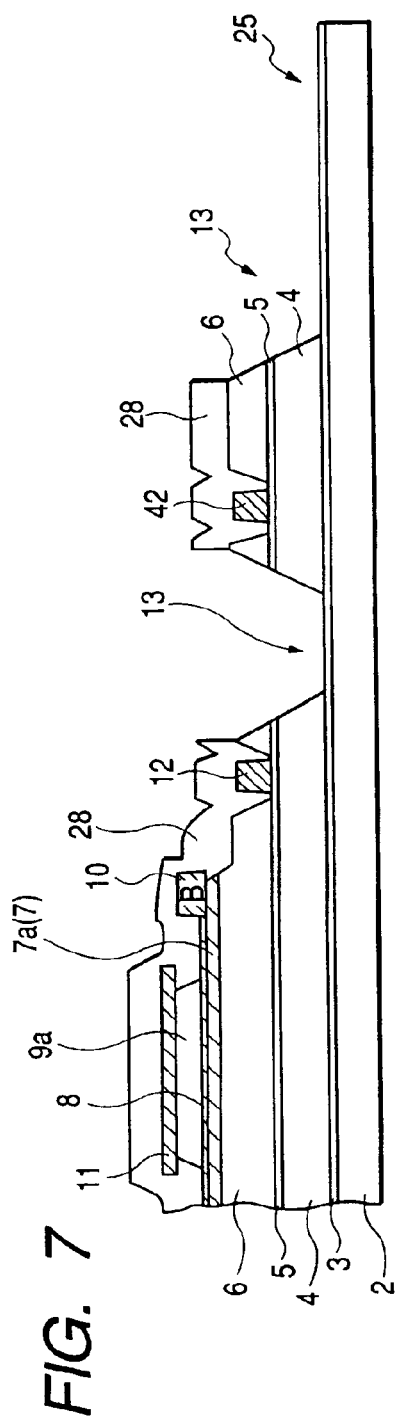
FIG. 7 is a cross-sectional view of a portion of a semiconductor substrate which is subjected to a first etching treatment for forming a separation groove in a method for manufacturing the high frequency power amplifier of the embodiment 1.

As shown in FIG. 7, using the insulation film 28 as a mask, the n-type GaAs layer 6 is etched using a mixed aqueous solution of phosphoric acid and hydrogen peroxide. Subsequently, the n-type InGaP layer 5 is etched by etching which uses hydrochloric acid as an etchant. Then, the n-type GaAs layer 4 is etched by etching which uses a mixed aqueous solution of phosphoric acid and hydrogen peroxide as an etchant. In this state, the n-type InGaP layer 3 remains as shown in FIG. 7.

Figure 8:
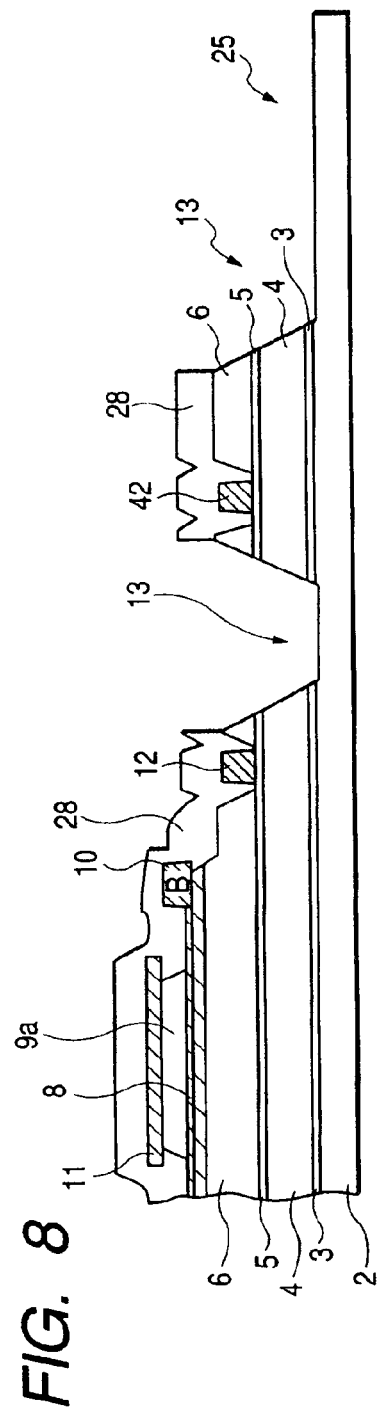
FIG. 8 is a cross-sectional view of a portion of a semiconductor substrate which is subjected to a second etching treatment for forming a separation groove in a method for manufacturing the high frequency power amplifier of the embodiment 1.

Subsequently, as shown in FIG. 8, using the insulation film 28 as a mask, the n-type InGaP layer 3 is successively etched by etching which uses hydrochloric acid as an etchant. Subsequently, a surface layer of the semi-insulating GaAs substrate 2 is etched to a given depth by etching which uses a mixed aqueous solution of phosphoric acid and hydrogen peroxide as an etchant. Accordingly, the separation groove 13 is formed around regions on which the HBT and the Schottky diode are formed. In the resistance element forming region, a surface layer portion of the semi-insulating GaAs substrate 2 is etched. Although a portion of the semi-insulating GaAs substrate 2 is also etched in this embodiment, etching may be stopped in a state that the n-type InGaP layer 3 is etched.

In the formation of this separation groove 13, to perform etching of the n-type GaAs layer 4, after stopping the etching at the n-type InGaP layer 3 which constitutes an etching stopper layer, the n-type InGaP layer 3 is etched and, thereafter, a surface layer portion of the semi-insulating GaAs substrate 2 which exposes a surface thereof is etched to a given depth (50 µm, for example). By adopting such a technique, it is possible to always set a height of the groove bottom of the separation groove 13 to a fixed value. This is because that a depth of etching of the surface layer portion of the semi-insulating GaAs substrate 2 is short and hence, the depth of etching can be accurately controlled based on the etching time.

That is, respective semiconductor layers have irregularities in thickness when they are formed and hence, in the formation of the separation groove 13 by etching, when either one of a method (1) in which the n-type GaAs layer 6, the n-type GaAs layer 4 and the semi-insulating GaAs substrate 2 are etched under time control without forming an etching stopper layer in an intermediate portion thereof and a method (2) in which the n-type GaAs layer 4 and the semi-insulating GaAs substrate 2 are etched under time control without forming an etching stopper layer in an intermediate portion thereof, the depth of etching becomes deep. Accordingly, the etching time is prolonged and the irregularities of the depth of the separation groove 13 is increased so that the shortage of etching or the excessive etching is liable to easily occur.

To the contrary, the height of the groove bottom of the separation groove 13 in the first embodiment 1 is determined based on the etching from the surface of the semi-insulating GaAs substrate 2 which is exposed by removing the n-type InGaP layer 3 and the depth of etching is also shallow, that is approximately 50 µm, for example. Accordingly, even when the etching under time control is performed, the irregularities in the depth of the groove bottom becomes small so that a step of the separation groove 13 portion takes a proper value and hence, a large step is not formed.

Figure 26:
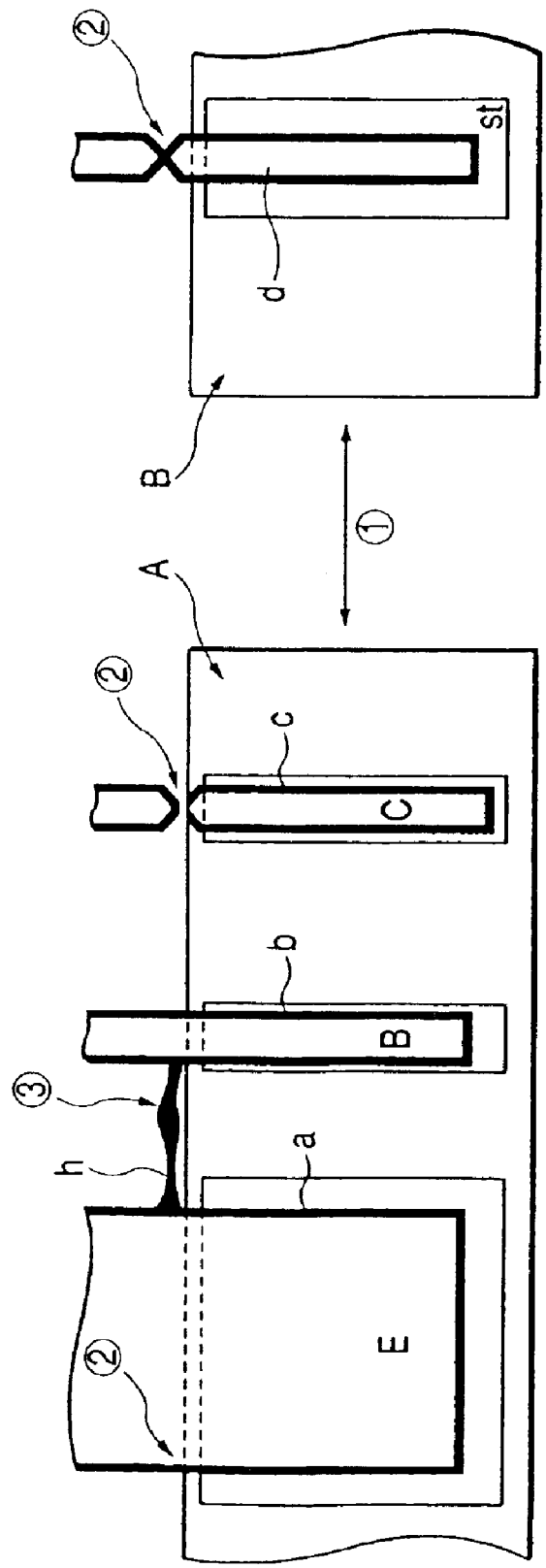
FIG. 26 is a schematic view showing a defective example attributed to a shortage of etching or an excessive etching in the formation of a separation groove by etching.

Due to the formation of the separation groove by etching which adopts such an etching treatment technique, the shortage of etching and the excessive etching can be prevented. As a result, it is possible to prevent the occurrence of the isolation failure between the region where the HBT is formed and the region where the Schottky diode is formed as indicated by (1) shown in FIG. 26. It is also possible to prevent the disconnection of lines at the stepped portion indicated by (2) in FIG. 26. Further, it is possible to prevent the occurrence of short-circuit failure between the lines which is attributed to the residue of the metal layer at a portion along the step indicated by (3) in FIG. 26.

Subsequently, as shown in FIG. 9, the insulation film 14 having a thickness of 400 nm and made of $SiO_2$ is formed over a whole area of the surface of the wafer 25 and, thereafter, an opening is selectively formed in the insulation film 14 over the n-type GaAs layer 6 in the Schottky diode forming region. Then, the Schottky electrode 41 is formed in the above-mentioned opening portion and, at the same time, the resistance film 46 is formed over the insulation film 14 in the resistance element forming region. The Schottky electrode 41 and the resistance film 46 are simultaneously formed using the same material. That is, for example, the WSiN film having a thickness of 200 nm is formed by a sputtering method and, thereafter, the patterning is performed as shown in FIG. 9 by dry etching using a $SF_6$ gas or the like. The sheet resistance value of the WSiN film having a thickness of 200 nm is 50 to 100 Ω. Although the film thickness of the WSiN film may be set to a value which falls in a range of approximately 0.1 to 0.5 µm, for example, the film thickness is set to 0.2 µm in this embodiment 1.

To form the resistance film and to establish the Schottky junction, the Schottky electrode 41 and the resistance film 46 are formed of alloy which is mainly made of a high melting-point material such as WSiN or the like or silicide. As the material of the Schottky electrode and the resistance film, WSi, WN, TaSi, TaN, TaSiN, TiN, TiSiN, MoSi, MoSiN and the like can be used. The silicide which constitutes high melting-point metal forms the Schottky electrode which is stable against GaAs.

Subsequently, as shown in FIG. 10, the interlayer insulation film 15 having a thickness of 500 nm and made of $SiO_2$ is formed over the entire area of the surface of the wafer 25 and, thereafter, contact holes are selectively formed and the lines 16 are selectively formed using a photolithography technique and an etching technique which are usually adopted. As shown in FIG. 10, the contact holes are formed such that the contact holes face the emitter electrode 11, the base electrode 10, the collector electrode 12, the ohmic electrode 42 for diode, the Schottky electrode 41 and two portions of the resistance film 46. The lines 16 which are filled in these contact holes are electrically connected to respective electrodes (resistance films).

To reduce the electric resistance of the Schottky electrode 41, the film thickness of the WSiN film is made small, that is, 0.2 µm and, at the same time, the line 16 which is connected to the WSiN film is overlapped to the WSiN film by a given length. Here, a gold layer may be used as the line 16 to reduce the electric resistance.

Provided that the size of the Schottky electrode 41 is set to a size of 10 µm×10 µm, even when the thickness of the WSiN film is 1 µm, the parasitic resistance is 0.2 Ω and hence, there is no problem. Further, with respect to the resistance film, the film is made thin to maintain the flatness. The resistance ratio ρ of WSiN is changed corresponding to the composition of nitrogen and silicon and can take a resistance value of 500 to 5000 µΩcm, for example. In this case, the sheet resistance ps of the resistance film can be set to 10 to 500 Ω/□ based on a formula ρs=ρ/t, wherein t is a thickness of the resistance film.

Although not shown in the drawing, another second lines may be formed apart from the lines 16 when necessary.

Subsequently, the insulation film 17 having a total thickness of 600 nm which is formed of the SiN film and the $SiO_2$ film (see FIG. 1) is formed over the whole area of the surface of the wafer 25 as a passivation film. Then, the thickness of the semi-insulating GaAs substrate 2 is reduced to 100 to 50 µm as described previously, and the semi-insulating GaAs substrate 2 is divided by cutting longitudinally as well as laterally so as to produce the semiconductor devices 1. A portion of the semiconductor device 1 is shown in FIG. 1.

By adopting such a method for manufacturing the HBT, the diode and the resistance, the semiconductor device 1 has the constitution which is expressed as an equivalent circuit shown in FIG. 2. That is, the equivalent circuit is comprised of a power transistor Tr3 and a bias circuit which suppresses the change of an idle current attributed to the temperature change of the power transistor Tr3. A collector electrode of the power transistor Tr3 is connected to a power supply voltage Vcc and an emitter electrode of the power transistor Tr3 is earthed (grounded). A base electrode of the power transistor Tr3 is connected to an emitter electrode of a transistor Tr2 through a resistance element R4 and a bias potential is given by a resistance element R5.

A collector electrode of the transistor Tr2 is connected to a power supply voltage Vcc 2 and an emitter electrode of the transistor Tr2 is grounded through the resistance element R5. A base electrode of the transistor Tr2 is connected to a power supply voltage V1 through a resistance element R1 and, at the same time, a bias voltage is given to the bias electrode through the Schottky diodes S1, S2, a transistor Tr1 which has a base and a collector thereof short-circuited and a resistance element R2. Due to such a constitution, the change of the idle current which is generated when temperature changes and flows into the transistor Tr3 can be suppressed.

Following advantageous effects can be obtained by the first embodiment.

(1) Since the Schottky electrode 41 of the Schottky diode and the resistance film 46 of the resistance element are simultaneously formed using the same material (WSiN), the number of steps can be reduced so that the manufacturing cost of the semiconductor device can be reduced.

Figure 12:
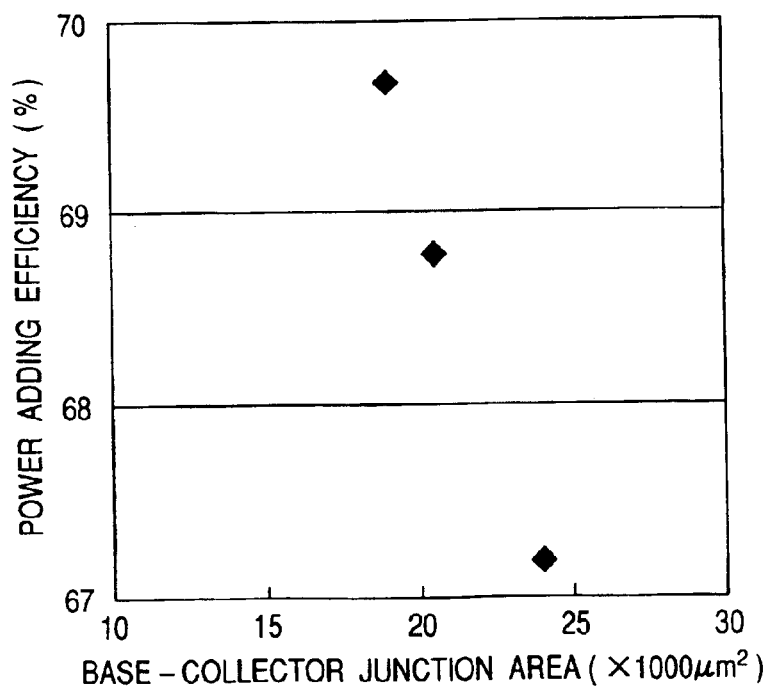
FIG. 12 is a graph showing the correlation between a base-collector junction area and the power adding efficiency in the semiconductor device of the embodiment 1.

(2) The base electrode 10 is formed such that the base electrode 10 surrounds the emitter electrode 11, the mask for etching is formed to the portion including the base electrode 10 and the emitter electrode 11 except for the outer periphery of the base electrode 10, and the mesa-shaped base layer 7a is formed using this mask and the emitter electrode 11 as masks and hence, the base-collector junction area can be reduced by side etching whereby the capacitance between the base and the collector can be reduced. Accordingly, the basic high frequency characteristics (for example, maximum oscillation frequency f max and the like) of the hetero junction bipolar transistor can be enhanced so that the high-speed operation and high performance of the hetero junction bipolar transistor can be further enhanced. FIG. 12 is a graph showing the correlation between the base-collector junction area and the power adding efficiency. As can be understood from this graph, when the sum of the base-collector junction areas of the HBT in all power stages is reduced by 20%, the power adding efficiency is enhanced by approximately 2%. This is an example of evaluation of GaAs-HBT for portable cellular phone.

(3) In performing etching of the n-type GaAs layer 6, the wet etching which uses the mixed aqueous solution of phosphoric acid and hydrogen peroxide is adopted and hence, although the n-type GaAs layer 6 can be etched completely in the etching region, the n-type InGaP layer 5 disposed below the n-type GaAs layer 6 is not etched. Accordingly, since the thickness of the n-type GaAs layer 4 is not changed and hence, the resistance value of the collector is not changed so that there is no possibility that the collector resistance is increased whereby it is possible to manufacture the hetero junction bipolar transistors which exhibit the stable characteristics.

(4) This embodiment adopts the structure in which the n-type InGaP layer 3 which constitutes the etching stopper layer is formed over the main surface of the semi-insulating GaAs substrate 2 and the n-type GaAs layer 4 is formed over the n-type InGaP layer 3. Accordingly, in forming the groove bottom of the separation groove 13, the etching of the n-type GaAs layer 4 is stopped at the n-type InGaP layer 3 and, thereafter, the n-type InGaP layer 3 is etched by etching which uses a different etchant. Here, the surface of the semi-insulating GaAs substrate 2 is hardly etched. Subsequently, the surface layer portion of the semi-insulating GaAs substrate 2 is etched by changing the etchant again so as to form the groove bottom. Accordingly, the etching time of the surface layer portion of the semi-insulating GaAs substrate 2 can be shortened so that the control of the depth of etching becomes accurate. As a result, the shortage of etching and the excessive etching hardly occur.

Accordingly, the isolation defect attributed to the shortage of etching hardly occurs. Further, the excessive etching does not occur and hence, the large step is not generated. Since the large step is not generated, it is possible to prevent the disconnection of line at the stepped portion and the residue of metal when the line is formed at the stepped portion is eliminated whereby the short circuit between the lines can be prevented. Accordingly, the manufacturing yield factor of the semiconductor device is enhanced and the product cost can be reduced.

(Embodiment 2)

FIG. 13 to FIG. 16 are drawings showing a method for manufacturing a high frequency power amplifier which incorporates a bias circuit therein according to another embodiment of the present invention (embodiment 2). This embodiment 2 is characterized in that an emitter electrode and a Schottky electrode of a HBT are simultaneously formed using a same material.

Figure 13:
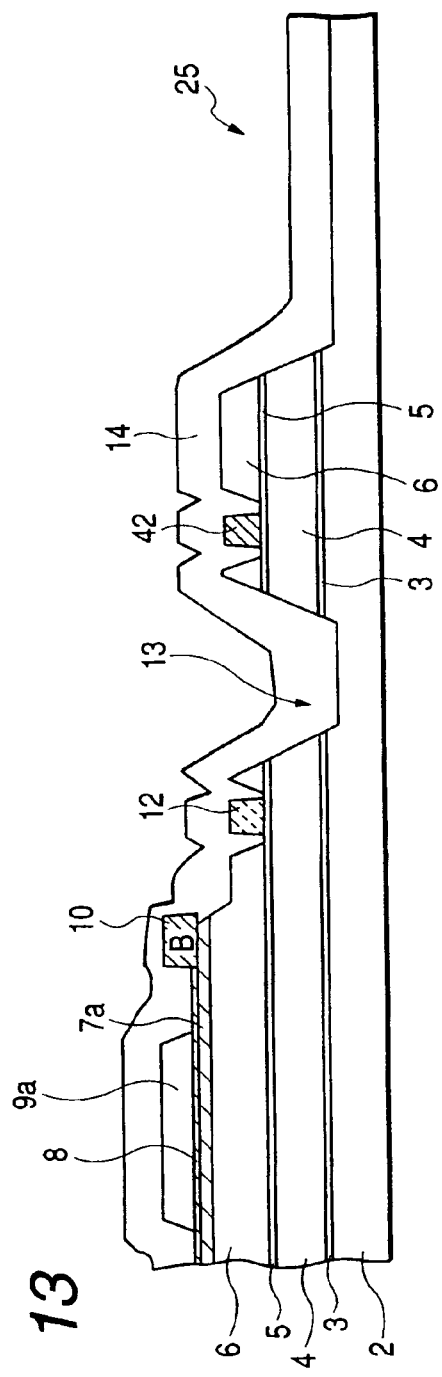
FIG. 13 is a cross-sectional view of a portion of a semiconductor substrate on which an interlayer insulation film which covers a collector electrode, a diode electrode and the like is formed in a method for manufacturing a high frequency power amplifier in which a bias circuit which constitutes another embodiment (embodiment 2) of the present invention is incorporated.

FIG. 13 is a cross-sectional view of a portion of a semiconductor substrate on which an insulation film 14 which covers the collector electrode 12 and an ohmic electrode 42 for diode is formed. The drawing shows a stage in which the separation groove 13 shown in FIG. 8 in the embodiment 1 is formed and, thereafter, as shown in FIG. 9, an insulation film 14 is formed. In this state, however, the Schottky electrode 41 is not formed. Also in this embodiment 2, an emitter layer 9a is formed using a photo resist as a mask and hence, there is no possibility that the emitter electrode is used as the mask as in the case of the embodiment 1. Accordingly, an emitter electrode is not formed even at this stage.

Then, contact holes are formed by selectively removing the insulation film 14 over the emitter layer 9a and an n-type GaAs layer 6 in a Schottky diode forming region and electrodes are formed in these contact hole portions. As a result, an emitter electrode 11 is formed over the emitter layer 9a and a Schottky electrode 41 is formed over the n-type GaAs layer 6 in the Schottky diode forming region. The emitter electrode 11 and the Schottky electrode 41 are simultaneously formed using a same material.

Figure 14:
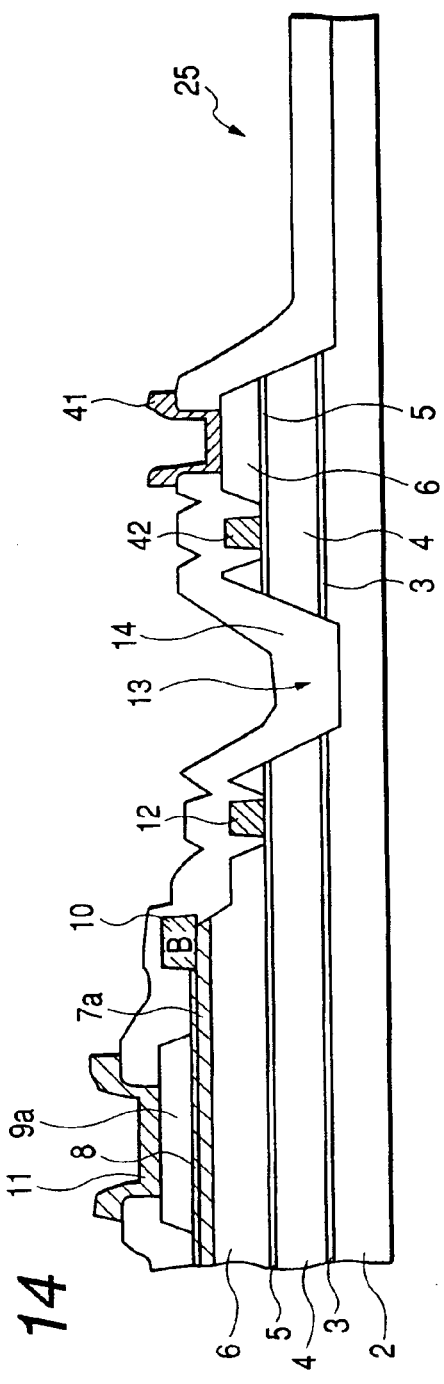
FIG. 14 is a cross-sectional view of a portion of a semiconductor substrate on which an emitter electrode and a Schottky electrode for diode are formed in a method for manufacturing the high frequency power amplifier of the embodiment 2.

That is, after forming a WSi film having a thickness of 300 nm, for example, by a sputtering method, dry etching is applied to the WSi film using a $SF_6$ gas or the like so as to form the emitter electrode 11 and the Schottky electrode 41 shown in FIG. 14. This formation process is similar to the process for forming the Schottky electrode 41 and the resistance film 46 in the embodiment 1 although they differ in material.

Figure 15:
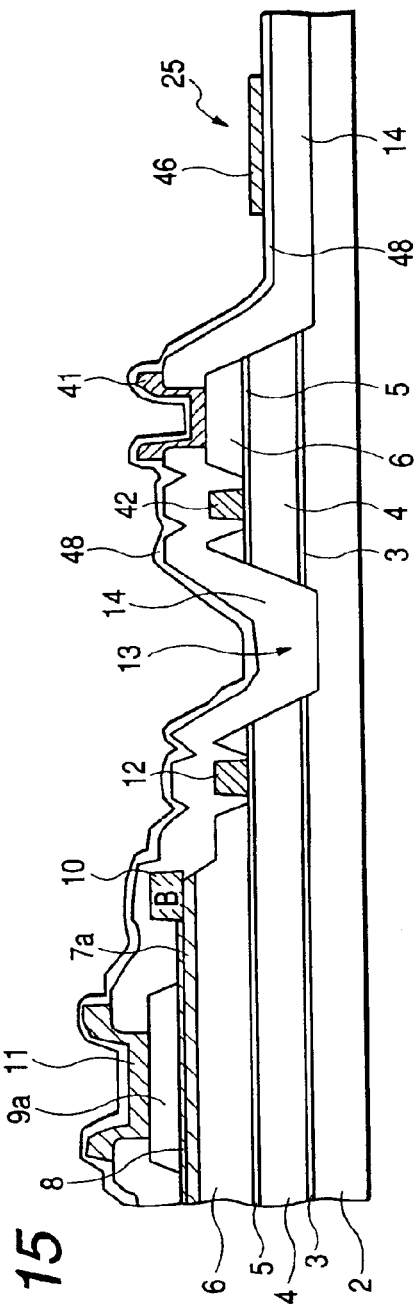
FIG. 15 is a cross-sectional view of a portion of a semiconductor substrate on which a second interlayer film and a resistant film are formed in a method for manufacturing a high frequency power amplifier of the embodiment 2.

Then, as shown in FIG. 15, an insulation film 48 having a thickness of 100 nm is formed over a whole area of a main surface of a wafer 25 and, thereafter, a resistance film 46 is selectively formed over an insulation film 48 in a resistance element forming region. In this embodiment 2, the resistance film 46 is formed of a NiCr film having a thickness of 150 nm.

Figure 16:
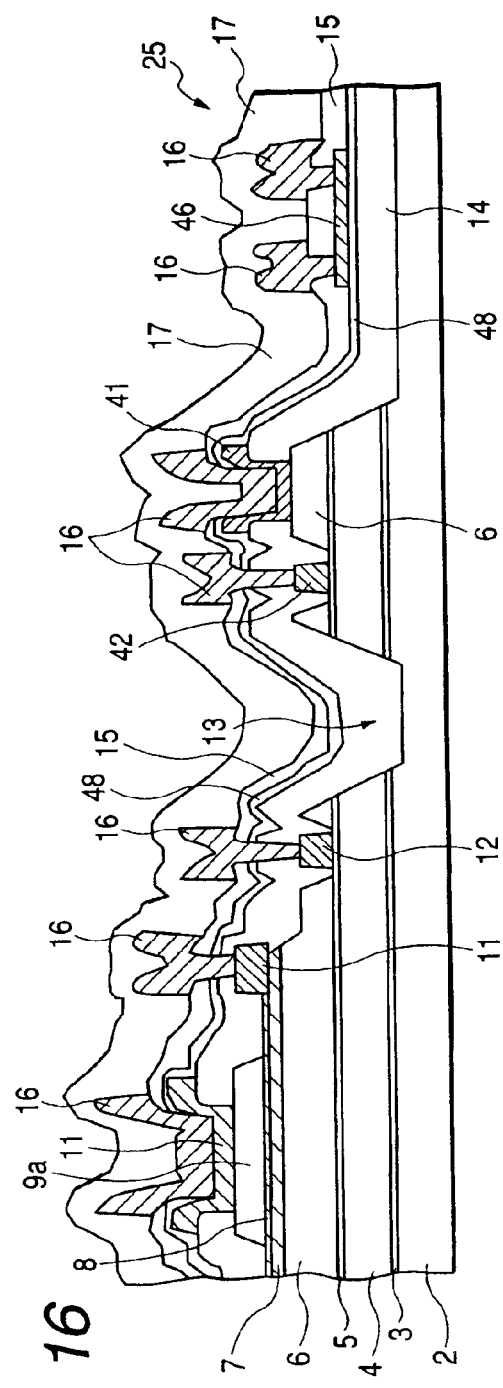
FIG. 16 is a cross-sectional view of a portion of a semiconductor substrate on which lines and a final passivation film are formed in a method for manufacturing a high frequency power amplifier of the embodiment 2.

Then, as shown in FIG. 16, an interlayer insulation film 15 having a thickness of 500 nm is formed over the whole area of the surface of the wafer 25 and, thereafter, contact holes are selectively formed and lines 16 are selectively formed using a photolithography technique and an etching technique which are usually employed. As shown in FIG. 16, the contact holes are formed such that the contact holes face the emitter electrode 11, the base electrode 10, the collector electrode 12, the ohmic electrode 42 for diode, the Schottky electrode 41 and two portions of the resistance film 46. The lines 16 which are filled in these contact holes are electrically connected to respective electrodes (resistance films).

Although not shown in the drawings, another second lines may be formed apart from the lines 16 when necessary.

Subsequently, the insulation film 17 having a total thickness of 600 nm which is formed of the SiN film and the $SiO_2$ film is formed over the whole area of the surface of the wafer 25 as a passivation film. Then, the thickness of the semi-insulating GaAs substrate 2 is reduced to 100 to 50 $\mu$m, and the semi-insulating GaAs substrate 2 is divided by cutting longitudinally as well as laterally so as to produce the semiconductor devices.

In this embodiment 2, the emitter electrode 11 and the Schottky electrode 41 of the Schottky diode can be simultaneously formed using the same material (WSiN) so that the number of steps can be reduced whereby the manufacturing cost of the semiconductor device can be reduced.

Further, in the same manner as the embodiment 1, it is possible to achieve the shortening of the base-collector junction length and the reduction of resistance of the collector layer. It is also possible to prevent the shortage of etching and the excessive etching in the formation of the separation groove.

(Embodiment 3)

FIG. 17 to FIG. 22 are drawings showing a method for manufacturing a high frequency power amplifier which incorporates a bias circuit therein according to another embodiment of the present invention (embodiment 3). This embodiment 3 is an example of the method for manufacturing semiconductors in which an emitter electrode, a Schottky electrode and a resistance film are simultaneously formed using a same material.

According to this embodiment 3, in the same manner as the embodiment 1, by sequentially laminating an n-type InGaP layer 3, an n-type GaAs layer 4, an n-type InGaP layer 5, an n-type GaAs layer 6, a p-type GaAs layer 7, an n-type InGaP layer 8, and an n-type GaAs layer 9 to a main surface of the semi-insulating GaAs substrate 2 using a MOCVD method or the like, a wafer 25 is formed. Thereafter, using a photolithography technique and an etching technique which are usually employed, the n-type GaAs layer 9 is selectively removed so as to form a mesa-shaped emitter layer 9a from the n-type GaAs layer 9 as shown in FIG. 17.

Subsequently, as shown in FIG. 18, using a lift-off method in the same manner as the embodiment 1, a base electrode 10 is formed over the n-type InGaP layer 8 in the HBT forming region. The base electrode 10 is subjected to the alloying treatment and the base electrode 10 is electrically connected to the p-type GaAs layer 7 which eventually constitutes a base layer 7a. Thereafter, the n-type GaAs layer (n-type InGaAs/n-type GaAs layer) 9 is etched using a photo resist not shown in the drawings and the base electrode 10 as an etching mask, and the mesa-shaped layer 7a whose periphery is positioned inside from a periphery of the base electrode 10 is formed by side etching.

Figure 19:
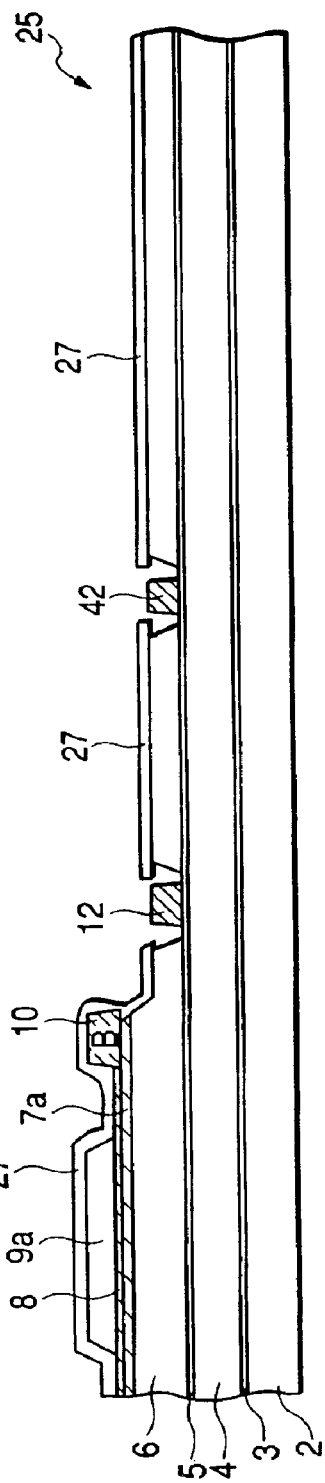
FIG. 19 is a cross-sectional view of a portion of a semiconductor substrate on which a collector electrode and an electrode for diode are formed in a method for manufacturing a high frequency power amplifier of the embodiment 3.

Then, as shown in FIG. 19, an insulation film 27 having a thickness of 100 nm and made of $SiO_2$ is formed over a surface of the wafer 25 in the same manner as the embodiment 1. Thereafter, contact holes for forming electrodes are formed by selectively etching the n-type GaAs layer 6 using a photolithography technique and an etching technique which are usually employed. Thereafter, using a lift-off method, a collector electrode 12 and an ohmic electrode 42 for diode are formed. The collector electrode 12 and the ohmic electrode 42 for diode are formed by a sputtering method using AuGe as a material until they obtain a thickness of 300 nm.

In etching the above-mentioned n-type GaAs layer 6, wet etching which uses a mixed aqueous solution of phosphoric acid and hydrogen peroxide is adopted and hence, although it is possible to completely etch the n-type GaAs layer 6 in the etching region, the n-type InGaP layer 5 below the n-type GaAs layer 6 is not etched. Accordingly, the thickness of the n-type GaAs layer 4 is not changed so that collector resistance value is not changed whereby there is no possibility that the collector resistance is increased by etching.

Figure 20:
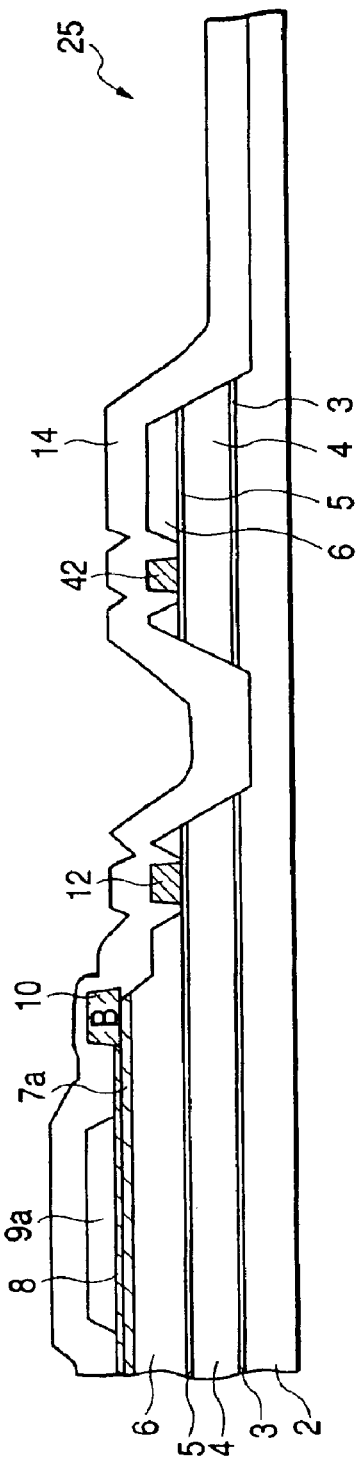
FIG. 20 is a cross-sectional view of a portion of a semiconductor substrate on which an interlayer insulation film is formed in a method for manufacturing a high frequency power amplifier of the embodiment 3.

Subsequently, as shown in FIG. 20, in the same manner as the embodiment 1, using a photolithography technique and an etching technique which are usually employed, the separation groove 13 for isolation is formed so as to make the HBT forming region and the Schottky diode forming region electrically independent from each other. Further, an insulation film 14 made of $SiO_2$ is formed over the whole area of a main surface of the wafer 25.

Figure 21:
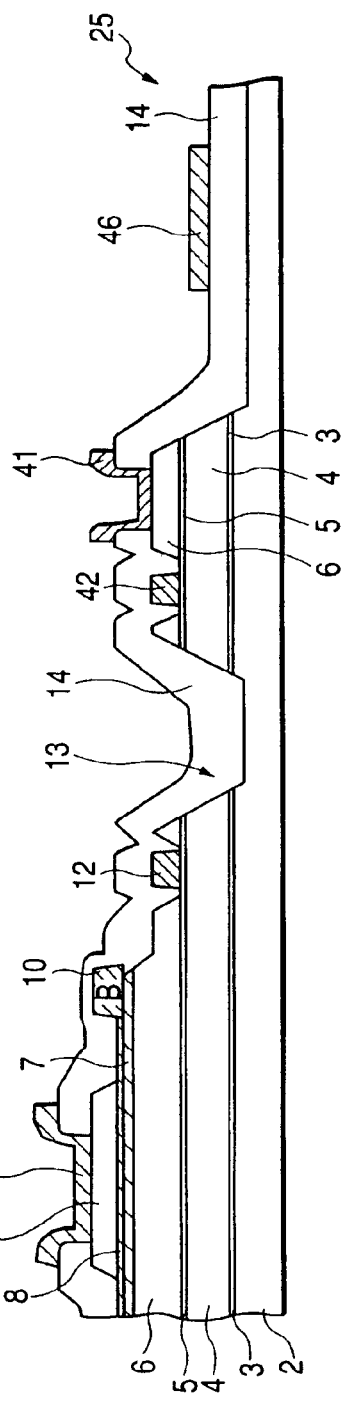
FIG. 21 is a cross-sectional view of a portion of a semiconductor substrate on which an emitter electrode, a Schottky electrode for diode and a resistance film are formed in a method for manufacturing a high frequency power amplifier of the embodiment 3.

Then, as shown in FIG. 21, using a technique similar to the technique used in the embodiment 1, the insulation film 14 formed over the emitter layer 9a and the n-type GaAs layer 6 in the Schottky diode forming region are selectively removed thus forming the contact holes and, thereafter, the emitter electrodes 11, the Schottky electrode 41 and the resistance film 46 are simultaneously formed using the same material.

Figure 22:
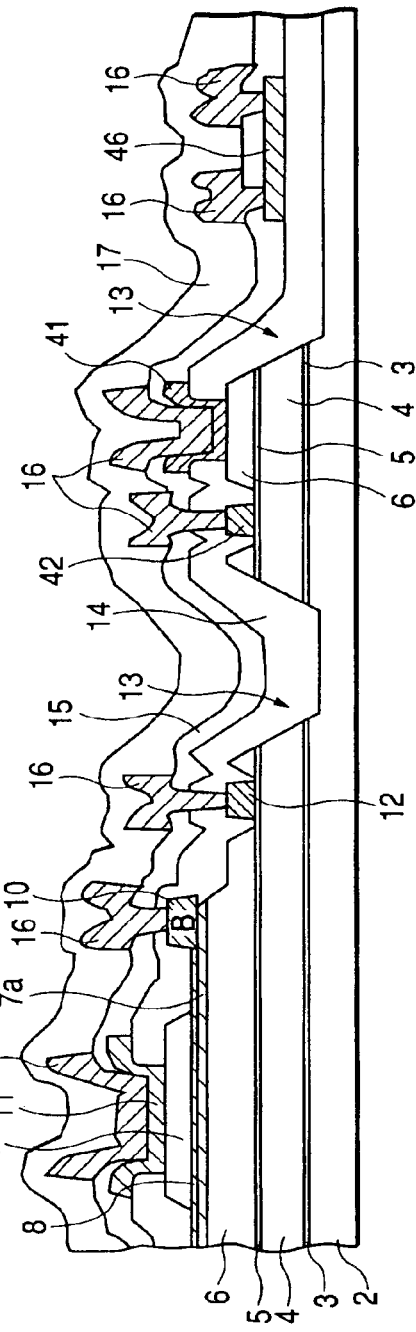
FIG. 22 is a cross-sectional view of a portion of a semiconductor substrate on which lines and a final passivation film are formed in a method for manufacturing a high frequency power amplifier of the embodiment 3.
Figure 23A:
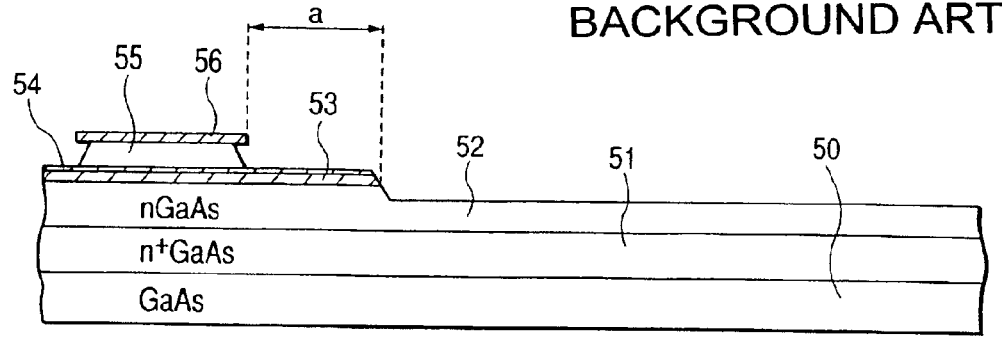
FIG. 23 is a cross-sectional view of a portion of a semiconductor substrate in a given manufacturing step of a high frequency power amplifier which is manufactured prior to the present invention.
Figure 23B:
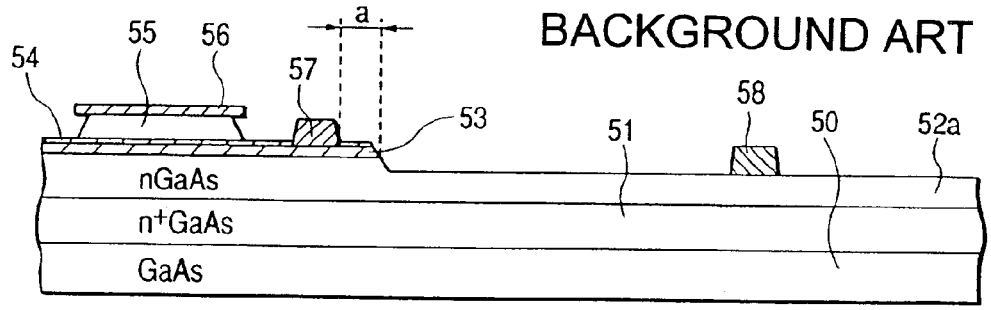
Figure 24:
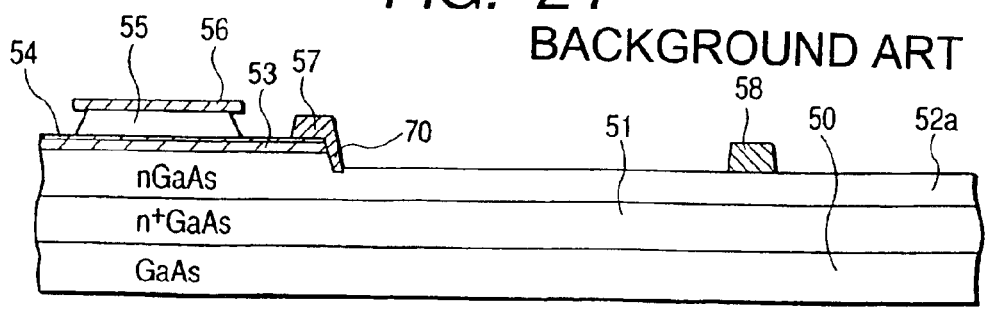
FIG. 24 is a cross-sectional view of a portion of a semiconductor substrate showing a defective example in a given manufacturing step of a high frequency power amplifier which is manufactured prior to the present invention.

Subsequently, as shown in FIG. 22, in the same manner as the embodiment 1, the interlayer insulation film 15 is formed over the entire area of the surface of the wafer 25 and, thereafter, contact holes are selectively formed and the lines 16 are selectively formed using a photolithography technique and an etching technique which are usually employed. As shown in FIG. 22, the contact holes are formed such that the contact holes face the emitter electrode 11, the base electrode 10, the collector electrode 12, the ohmic electrode 42 for diode, the Schottky electrode 41 and two portions of the resistance film 46. The lines 16 which are filled in these contact holes are electrically connected to respective electrodes (resistance films).

To reduce the electric resistance of the emitter electrode 11 and the Schottky electrode 41, the film thickness of the WSiN film is made small, that is, 0.2 $\mu$m and, at the same time, the line 16 which is connected to the WSiN film is overlapped to the WSiN film by a given length. Here, a gold layer may be used as the line 16 to reduce the electric resistance.

Then, an insulation film 17 is formed over the whole area of the surface of the wafer 25 as a passivation film and the semi-insulating GaAs substrate 2 is divided longitudinally and laterally by cutting so as to manufacture semiconductor devices.

In this embodiment 3, the emitter electrode 11 of the HBT, the Schottky electrode 41 of the Schottky diode and the resistance film 46 of the resistance element can be simultaneously formed using the same material (WsiN having a thickness of 200 nm, for example) so that the number of steps can be reduced whereby the manufacturing cost of the semiconductor device can be reduced.

Further, also in this embodiment 3, it is possible to achieve the shortening of the base-collector junction length and the reduction of resistance of the collector layer as well as to prevent the shortage of etching and the excessive etching in the formation of the separation groove.

Although the inventions which are made by the inventors have been specifically explained in conjunction with the embodiments, it is needless to say that the present inventions are not limited to the above-mentioned embodiments and various modifications can be made without departing from the gist of the inventions.

To briefly recapitulate advantageous effects obtained by typical inventions among the inventions disclosed in the present application, they are as follows.

(1) In forming the separation groove for isolation by etching, the shortage of etching and the excessive etching are hardly occur and hence, the manufacturing yield factor of the semiconductor device can be enhanced whereby the product cost can be reduced.

(2) Since the reduction of the base-collector capacitance can be obtained, it is possible to manufacture the semiconductor devices having hetero junction bipolar transistors which exhibit the faster operation and the excellent high frequency characteristics.

What is claimed is:

1. A method for manufacturing a semiconductor device having a bipolar transistor, a Schottky diode, and a resistance element formed in a first region, a second region, and a third region of a semiconductor substrate, respectively, said method comprising the steps of:

(a) forming the bipolar transistor in the first region;

(b) forming a first semiconductor layer of the Schottky diode in the second region;

(c) forming an ohmic electrode of the Schottky diode, electrically connected to the first semiconductor layer, in the second region;

(d) forming a first conductive film having a first portion and a second portion in the second and third regions, respectively; and (e) forming a first wiring and a second wiring electrically connected to the second portion of the first conductive film;

wherein the first portion of the first conductive film and the first semiconductor layer of the Schottky diode have a Schottky contact; and the first and second portions of the first conductive film are a Schottky electrode of the Schottky diode and a resistance film of the resistance element, respectively.

2. A method according to claim 1, wherein the bipolar transistor is a hetero-junction bipolar transistor.

3. A method according to claim 2, wherein the semiconductor substrate is made of GaAs.

4. A method according to claim 3, wherein the Schottky electrode and the resistance film are made of WSiN.

5. A method for manufacturing a semiconductor device having a bipolar transistor, a Schottky diode, and a resistance element formed in a first region, a second region, and a third region of a semiconductor substrate, respectively, said method comprising the steps of:

(a) forming an emitter layer of the bipolar transistor in the first region;

(b) forming a base layer of the bipolar transistor, under the emitter layer, in the first region;

(c) forming a collector layer of the bipolar transistor, under the base layer, in the first region, and a first semiconductor layer of the Schottky diode in the second region;

(d) forming an ohmic electrode of the Schottky diode, electrically connected to the first semiconductor layer, in the second region;

(e) forming a first conductive film having a first portion and a second portion in the second and third regions, respectively; and (f) forming a first wiring and a second wiring electrically connected to the second portion of the first conductive film;

wherein the collector layer of the bipolar transistor and the first semiconductor layer of the Schottky diode are made of a same layer;

the first portion of the first conductive film and the first semiconductor layer of the Schottky diode have a Schottky contact; and the first and second portions of the first conductive film are a Schottky electrode of the Schottky diode and a resistance film of the resistance element, respectively.

6. A method according to claim 5, wherein a separation groove is formed between the first region and the second region.

7. A method according claim 6, wherein the bipolar transistor is a hetero-junction bipolar transistor, and the semiconductor substrate is made of GaAs.

8. A method according to claim 5, further comprising the step of:

(g) forming a third wiring electrically connected to the ohmic electrode, a fourth wiring electrically connected to the Schottky electrode, a fifth wiring electrically connected to the emitter layer, a sixth wiring electrically connected to the base layer, and a seventh wiring electrically connected to the collector layer, wherein the first to seventh wirings are made of a same layer.

9. A method according to claim 1, wherein in the step (e), a third wiring electrically connected to the ohmic electrode, an a fourth wiring electrically connected to the first portion of the first conductive film are also formed.

10. A method according to claim 9, wherein the first to fourth wirings are made of a same layer.

11. A method according to claim 1, further comprising the steps of:

(f) between the steps (c) and (d), forming a first interlayer insulating film over the first semiconductor layer and ohmic electrode of the Schottky diode; and (g) forming an opening in the first interlayer insulating film, which exposes the first semiconductor layer of the Schottky diode;

wherein in the step (d), the first portion of the first conductive film is formed in the opening; and the second portion of the first conductive film is formed over the first interlayer insulating film.

12. A method according to claim 11, further comprising the steps of:

(h) forming a second interlayer insulating film over the resistance film and Schottky electrode; and (i) forming a first and a second contact hole, which expose the resistance film, in the second interlayer insulating film;

wherein the first and second wirings are formed over the second interlayer insulating film; and the first and second wirings and the resistance film are electrically connected via the first and second contact holes.

13. A method according to claim 5, further comprising the steps of:

(g) between the steps (d) and (e), forming a first interlayer insulating film over the first semiconductor layer, ohmic electrode and emitter layer of the bipolar transistor; and (h) forming an opening in the first interlayer insulating film, which exposes the first semiconductor layer of the Schottky diode;

wherein in the step (e), the first portion of the first conductive film is formed in the opening; and the second portion of the first conductive film is formed over the first interlayer insulating film.

14. A method according to claim 13, further comprising the steps of:

(i) forming a second interlayer insulating film over the resistance film, Schottky electrode of the Schottky diode and emitter layer of the bipolar transistor; and (j) forming a first and a second contact hole, which expose the resistance film, in the second interlayer insulating film;

wherein the first and second wirings are formed over the second interlayer insulating film; and the first and second wirings and the resistance film are electrically connected via the first and second contact holes.

* * * * *